(12) United States Patent
Irani et al.

(10) Patent No.: US 7,638,835 B2
(45) Date of Patent: Dec. 29, 2009

(54) DOUBLE DENSITY NROM WITH NITRIDE STRIPS (DDNS)

(75) Inventors: Rustom Irani, Santa Clara, CA (US); Boaz Eitan, Ra'anana (IL); Ilan Bloom, Haifa (IL); Assaf Shappir, Kiryat Ono (IL)

(73) Assignee: Saifun Semiconductors Ltd., Netanya (IL)

( * ) Notice: Subject to any disclaimer, the term of this patent is extended or adjusted under 35 U.S.C. 154(b) by 109 days.

(21) Appl. No.: 11/646,430

(22) Filed: Dec. 28, 2006

(65) Prior Publication Data

US 2007/0200180 A1    Aug. 30, 2007

Related U.S. Application Data

(63) Continuation-in-part of application No. 11/489,237, filed on Jul. 18, 2006.

(60) Provisional application No. 60/777,114, filed on Feb. 28, 2006.

(51) Int. Cl.
*H01L 29/792* (2006.01)

(52) U.S. Cl. ............... 257/324; 257/309; 257/411; 257/374; 257/E29.309; 257/E21.18

(58) Field of Classification Search ............ 257/324, 257/E29.309
See application file for complete search history.

(56) References Cited

U.S. PATENT DOCUMENTS

| | | | |
|---|---|---|---|
| 3,881,180 A | 4/1975 | Gosney, Jr. |
| 3,895,360 A | 7/1975 | Cricchi et al. |
| 3,952,325 A | 4/1976 | Beale et al. |
| 4,016,588 A | 4/1977 | Ohya et al. |
| 4,017,888 A | 4/1977 | Christie et al. |
| 4,145,703 A | 3/1979 | Blanchard et al. |
| 4,151,021 A | 4/1979 | McElroy |
| 4,173,766 A | 11/1979 | Hayes |
| 4,173,791 A | 11/1979 | Bell |
| 4,247,861 A | 1/1981 | Hsu et al. |
| 4,257,832 A | 3/1981 | Schwabe et al. |
| 4,281,397 A | 7/1981 | Neal et al. |
| 4,306,353 A | 12/1981 | Jacobs et al. |
| 4,342,102 A | 7/1982 | Puar |
| 4,342,149 A | 8/1982 | Jacobs et al. |
| 4,360,900 A | 11/1982 | Bate |

(Continued)

FOREIGN PATENT DOCUMENTS

EP    0 656 628    6/1995

(Continued)

OTHER PUBLICATIONS

Benschop, Joe; 32 nm: Lithography at a Crossroad, Jun. 26, 2006 Published by ASML Netherlands B.V., De Run 6501, 5504 DR Veldhoven, The Netherlands.

(Continued)

*Primary Examiner*—Tu-Tu V Ho
(74) *Attorney, Agent, or Firm*—EMPK & Shiloh, LLP

(57) ABSTRACT

An NVM cell such as an NROM cell is formed using a portion of one ONO stack and an adjacent portion of a neighboring NROM stack. A gate structure is formed between (and atop) the two ONO portions, or "strips" (or "stripes"). This provides having two physically separated charge storage regions (nitride "strips", or "stripes") in each memory cell.

3 Claims, 13 Drawing Sheets

U.S. PATENT DOCUMENTS

| | | |
|---|---|---|
| 4,373,248 A | 2/1983 | McElroy |
| 4,380,057 A | 4/1983 | Kotecha et al. |
| 4,388,705 A | 6/1983 | Sheppard |
| 4,389,705 A | 6/1983 | Sheppard |
| 4,404,747 A | 9/1983 | Collins |
| 4,435,786 A | 3/1984 | Tickle |
| 4,448,400 A | 5/1984 | Harari |
| 4,471,373 A | 9/1984 | Shimizu et al. |
| 4,494,016 A | 1/1985 | Ransom et al. |
| 4,507,673 A | 3/1985 | Aoyama |
| 4,521,796 A | 6/1985 | Rajkanan et al. |
| 4,527,257 A | 7/1985 | Cricchi |
| 4,586,163 A | 4/1986 | Koike |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,725,984 A | 2/1988 | Ip et al. |
| 4,733,105 A | 3/1988 | Shin et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,847,808 A | 7/1989 | Kobatake |
| 4,857,770 A | 8/1989 | Partovi et al. |
| 4,870,470 A | 9/1989 | Bass, Jr. et al. |
| 4,888,735 A | 12/1989 | Lee et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,029,063 A | 7/1991 | Lingstaedt et al. |
| 5,042,009 A | 8/1991 | Kazerounian et al. |
| 5,075,245 A | 12/1991 | Woo et al. |
| 5,081,371 A | 1/1992 | Wong |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,236,853 A | 8/1993 | Hsue |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,092 A | 3/1994 | Hotta et al. |
| 5,295,108 A | 3/1994 | Higa |
| 5,305,262 A | 4/1994 | Yoneda |
| 5,310,693 A | 5/1994 | Hsue |
| 5,311,049 A | 5/1994 | Tsuruta |
| 5,315,541 A | 5/1994 | Harari et al. |
| 5,324,675 A | 6/1994 | Hayabuchi |
| 5,334,555 A | 8/1994 | Sugiyama et al. |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,369,615 A | 11/1994 | Harari et al. |
| 5,375,094 A | 12/1994 | Naruke |
| 5,381,374 A | 1/1995 | Shiraishi et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,428,621 A | 6/1995 | Mehrotra et al. |
| 5,434,825 A | 7/1995 | Harari et al. |
| 5,436,478 A | 7/1995 | Bergemont et al. |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,508,968 A | 4/1996 | Collins et al. |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,018 A | 9/1996 | Wang et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,566,125 A | 10/1996 | Fazio et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee et al. |
| 5,604,804 A | 2/1997 | Micali |
| 5,606,523 A | 2/1997 | Mirabel |
| 5,608,679 A | 3/1997 | Mi et al. |
| 5,612,642 A | 3/1997 | McClintock |
| 5,617,357 A | 4/1997 | Haddad et al. |
| 5,619,452 A | 4/1997 | Miyauchi |
| 5,623,438 A | 4/1997 | Guritz et al. |
| 5,627,790 A | 5/1997 | Golla et al. |

| | | | | | | |
|---|---|---|---|---|---|---|
| 5,633,603 A | 5/1997 | Lee | | RE36,179 E | 4/1999 | Shimoda |
| 5,636,288 A | 6/1997 | Bonneville et al. | | 5,892,710 A | 4/1999 | Fazio et al. |
| 5,644,531 A | 7/1997 | Kuo et al. | | 5,903,031 A | 5/1999 | Yamada et al. |
| 5,650,959 A | 7/1997 | Hayashi et al. | | 5,910,924 A | 6/1999 | Tanaka et al. |
| 5,654,568 A | 8/1997 | Nakao | | 5,920,503 A | 7/1999 | Lee et al. |
| 5,656,513 A | 8/1997 | Wang et al. | | 5,920,507 A | 7/1999 | Takeuchi et al. |
| 5,657,332 A | 8/1997 | Auclair et al. | | 5,926,409 A | 7/1999 | Engh et al. |
| 5,661,060 A | 8/1997 | Gill et al. | | 5,930,195 A | 7/1999 | Komatsu et al. |
| 5,663,907 A | 9/1997 | Frayer et al. | | 5,933,366 A | 8/1999 | Yoshikawa |
| 5,666,365 A | 9/1997 | Kostreski | | 5,933,367 A | 8/1999 | Matsuo et al. |
| 5,672,959 A | 9/1997 | Der | | 5,936,888 A | 8/1999 | Sugawara |
| 5,675,280 A | 10/1997 | Nomura | | 5,940,332 A | 8/1999 | Artieri |
| 5,677,867 A | 10/1997 | Hazani | | 5,946,258 A | 8/1999 | Evertt et al. |
| 5,677,869 A | 10/1997 | Fazio et al. | | 5,946,558 A | 8/1999 | Hsu |
| 5,683,925 A | 11/1997 | Irani et al. | | 5,949,714 A | 9/1999 | Hemink et al. |
| 5,689,459 A | 11/1997 | Chang et al. | | 5,949,728 A | 9/1999 | Liu et al. |
| 5,694,356 A | 12/1997 | Wong et al. | | 5,959,311 A | 9/1999 | Shih et al. |
| 5,696,929 A | 12/1997 | Hasbun et al. | | 5,963,412 A | 10/1999 | En |
| 5,708,608 A | 1/1998 | Park et al. | | 5,963,465 A | 10/1999 | Eitan |
| 5,712,814 A | 1/1998 | Fratin et al. | | 5,966,603 A | 10/1999 | Eitan |
| 5,712,815 A | 1/1998 | Bill et al. | | 5,969,989 A | 10/1999 | Iwahashi |
| 5,715,193 A | 2/1998 | Norman | | 5,969,993 A | 10/1999 | Takeshima |
| 5,717,581 A | 2/1998 | Canclini | | 5,973,373 A | 10/1999 | Krautschneider et al. |
| 5,717,632 A | 2/1998 | Richart et al. | | 5,982,666 A | 11/1999 | Campardo |
| 5,717,635 A | 2/1998 | Akatsu | | 5,986,940 A | 11/1999 | Atsumi et al. |
| 5,721,781 A | 2/1998 | Deo et al. | | 5,990,526 A | 11/1999 | Bez et al. |
| 5,726,946 A | 3/1998 | Yamagata et al. | | 5,991,201 A | 11/1999 | Kuo et al. |
| 5,745,410 A | 4/1998 | Yiu et al. | | 5,991,202 A | 11/1999 | Derhacobian et al. |
| 5,748,534 A | 5/1998 | Dunlap et al. | | 5,991,517 A | 11/1999 | Harari et al. |
| 5,751,037 A | 5/1998 | Aozasa et al. | | 5,999,444 A | 12/1999 | Fujiwara et al. |
| 5,751,637 A | 5/1998 | Chen et al. | | 5,999,494 A | 12/1999 | Holzrichter |
| 5,754,475 A | 5/1998 | Bill et al. | | 6,000,006 A | 12/1999 | Bruce et al. |
| 5,760,445 A | 6/1998 | Diaz | | 6,005,423 A | 12/1999 | Schultz |
| 5,760,634 A | 6/1998 | Fu | | 6,011,715 A | 1/2000 | Pasotti |
| 5,768,192 A | 6/1998 | Eitan | | 6,011,725 A | 1/2000 | Eitan |
| 5,768,193 A | 6/1998 | Lee et al. | | 6,018,186 A | 1/2000 | Hsu |
| 5,771,197 A | 6/1998 | Kim | | 6,020,241 A | 2/2000 | You et al. |
| 5,774,395 A | 6/1998 | Richart et al. | | 6,028,324 A | 2/2000 | Su et al. |
| 5,777,919 A | 7/1998 | Chi-Yung et al. | | 6,030,871 A | 2/2000 | Eitan |
| 5,781,476 A | 7/1998 | Seki et al. | | 6,034,403 A | 3/2000 | Wu |
| 5,781,478 A | 7/1998 | Takeuchi et al. | | 6,034,896 A | 3/2000 | Ranaweera et al. |
| 5,783,934 A | 7/1998 | Tran | | 6,037,627 A | 3/2000 | Kitamura et al. |
| 5,784,314 A | 7/1998 | Sali et al. | | 6,040,610 A | 3/2000 | Noguchi et al. |
| 5,787,036 A | 7/1998 | Okazawa | | 6,040,996 A | 3/2000 | Kong |
| 5,793,079 A | 8/1998 | Georgescu et al. | | 6,044,019 A | 3/2000 | Cernea et al. |
| 5,795,830 A | 8/1998 | Cronin et al. | | 6,044,022 A | 3/2000 | Nachumovsky |
| 5,801,076 A | 9/1998 | Ghneim et al. | | 6,063,666 A | 5/2000 | Chang et al. |
| 5,805,500 A | 9/1998 | Campardo et al. | | 6,064,226 A | 5/2000 | Earl |
| 5,808,506 A | 9/1998 | Tran | | 6,064,251 A | 5/2000 | Park |
| 5,812,449 A | 9/1998 | Song | | 6,064,591 A | 5/2000 | Takeuchi et al. |
| 5,812,456 A | 9/1998 | Hull et al. | | 6,074,916 A | 6/2000 | Cappelletti |
| 5,812,457 A | 9/1998 | Arase | | 6,075,402 A | 6/2000 | Ghilardelli |
| 5,815,435 A | 9/1998 | Van Tran | | 6,075,724 A | 6/2000 | Li et al. |
| 5,822,256 A | 10/1998 | Bauer et al. | | 6,078,518 A | 6/2000 | Chevallier |
| 5,825,683 A | 10/1998 | Chang et al. | | 6,081,456 A | 6/2000 | Dadashev |
| 5,825,686 A | 10/1998 | Schmitt-Landsiedel et al. | | 6,084,794 A | 7/2000 | Lu et al. |
| 5,828,601 A | 10/1998 | Hollmer et al. | | 6,091,640 A | 7/2000 | Kawahara et al. |
| 5,834,851 A | 11/1998 | Ikeda et al. | | 6,094,095 A | 7/2000 | Murray et al. |
| 5,835,935 A | 11/1998 | Estakhri et al. | | 6,097,639 A | 8/2000 | Choi et al. |
| 5,836,772 A | 11/1998 | Chang et al. | | 6,107,862 A | 8/2000 | Mukainakano et al. |
| 5,841,700 A | 11/1998 | Chang | | 6,108,240 A | 8/2000 | Lavi et al. |
| 5,847,441 A | 12/1998 | Cutter et al. | | 6,108,241 A | 8/2000 | Chevallier |
| 5,861,771 A | 1/1999 | Matsuda et al. | | 6,117,714 A | 9/2000 | Beatty |
| 5,862,076 A | 1/1999 | Eitan | | 6,118,207 A | 9/2000 | Ormerod et al. |
| 5,864,164 A | 1/1999 | Wen | | 6,118,692 A | 9/2000 | Banks |
| 5,867,429 A | 2/1999 | Chen et al. | | 6,122,198 A | 9/2000 | Haddad et al. |
| 5,870,334 A | 2/1999 | Hemink et al. | | 6,128,226 A | 10/2000 | Eitan et al. |
| 5,870,335 A | 2/1999 | Khan et al. | | 6,128,227 A | 10/2000 | Kim |
| 5,872,848 A | 2/1999 | Romney et al. | | 6,130,452 A | 10/2000 | Lu et al. |
| 5,875,128 A | 2/1999 | Ishizuka et al. | | 6,130,572 A | 10/2000 | Ghilardelli et al. |
| 5,877,537 A | 3/1999 | Aoki | | 6,130,574 A | 10/2000 | Bloch et al. |
| 5,880,620 A | 3/1999 | Gitlin et al. | | 6,133,095 A | 10/2000 | Eitan et al. |
| 5,886,927 A | 3/1999 | Takeuchi | | 6,134,156 A | 10/2000 | Eitan |

| | | |
|---|---|---|
| 6,137,718 A | 10/2000 | Reisinger |
| 6,147,904 A | 11/2000 | Liron |
| 6,147,906 A | 11/2000 | Bill et al. |
| 6,148,435 A | 11/2000 | Bettman |
| 6,150,800 A | 11/2000 | Kinoshita et al. |
| 6,154,081 A | 11/2000 | Pakkala et al. |
| 6,156,149 A | 12/2000 | Cheung et al. |
| 6,157,242 A | 12/2000 | Fukui |
| 6,157,570 A | 12/2000 | Nachumovsky |
| 6,163,048 A | 12/2000 | Hirose et al. |
| 6,163,484 A | 12/2000 | Uekubo |
| 6,169,691 B1 | 1/2001 | Pasotti et al. |
| 6,175,519 B1 | 1/2001 | Lu et al. |
| 6,175,523 B1 | 1/2001 | Yang et al. |
| 6,181,597 B1 | 1/2001 | Nachumovsky |
| 6,181,605 B1 | 1/2001 | Hollmer et al. |
| 6,185,143 B1 | 2/2001 | Perner et al. |
| 6,188,211 B1 | 2/2001 | Rincon-Mora et al. |
| 6,190,966 B1 | 2/2001 | Ngo et al. |
| 6,192,445 B1 | 2/2001 | Rezvani |
| 6,195,196 B1 | 2/2001 | Kimura et al. |
| 6,198,342 B1 | 3/2001 | Kawai |
| 6,201,282 B1 | 3/2001 | Eitan |
| 6,201,737 B1 | 3/2001 | Hollmer et al. |
| 6,205,055 B1 | 3/2001 | Parker |
| 6,205,056 B1 | 3/2001 | Pan et al. |
| 6,205,059 B1 | 3/2001 | Gutala et al. |
| 6,208,200 B1 | 3/2001 | Arakawa |
| 6,208,557 B1 | 3/2001 | Bergemont et al. |
| 6,214,666 B1 | 4/2001 | Mehta |
| 6,215,148 B1 | 4/2001 | Eitan |
| 6,215,697 B1 | 4/2001 | Lu et al. |
| 6,215,702 B1 | 4/2001 | Derhacobian et al. |
| 6,218,695 B1 | 4/2001 | Nachumovsky |
| 6,219,277 B1 | 4/2001 | Devin et al. |
| 6,219,290 B1 | 4/2001 | Chang et al. |
| 6,222,762 B1 | 4/2001 | Guterman et al. |
| 6,222,768 B1 | 4/2001 | Hollmer et al. |
| 6,232,632 B1 | 5/2001 | Liu |
| 6,233,180 B1 | 5/2001 | Eitan et al. |
| 6,240,032 B1 | 5/2001 | Fukumoto |
| 6,240,040 B1 | 5/2001 | Akaogi et al. |
| 6,246,555 B1 | 6/2001 | Tham |
| 6,252,442 B1 | 6/2001 | Malherbe |
| 6,252,799 B1 | 6/2001 | Liu et al. |
| 6,256,231 B1 | 7/2001 | Lavi et al. |
| 6,261,904 B1 | 7/2001 | Pham et al. |
| 6,265,268 B1 | 7/2001 | Halliyal et al. |
| 6,266,281 B1 | 7/2001 | Derhacobian et al. |
| 6,272,047 B1 | 8/2001 | Mihnea et al. |
| 6,275,414 B1 | 8/2001 | Randolph et al. |
| 6,281,545 B1 | 8/2001 | Liang et al. |
| 6,282,133 B1 | 8/2001 | Nakagawa et al. |
| 6,282,145 B1 | 8/2001 | Tran et al. |
| 6,285,246 B1 | 9/2001 | Basu |
| 6,285,574 B1 | 9/2001 | Eitan |
| 6,285,589 B1 | 9/2001 | Kajitani |
| 6,285,614 B1 | 9/2001 | Mulatti et al. |
| 6,292,394 B1 | 9/2001 | Cohen et al. |
| 6,297,096 B1 | 10/2001 | Boaz |
| 6,297,143 B1 | 10/2001 | Foote et al. |
| 6,297,974 B1 | 10/2001 | Ganesan et al. |
| 6,304,485 B1 | 10/2001 | Harari et al. |
| 6,307,784 B1 | 10/2001 | Hamilton et al. |
| 6,307,807 B1 | 10/2001 | Sakui et al. |
| 6,320,786 B1 | 11/2001 | Chang et al. |
| 6,324,094 B1 | 11/2001 | Chevallier |
| 6,326,265 B1 | 12/2001 | Liu et al. |
| 6,330,192 B1 | 12/2001 | Ohba et al. |
| 6,331,950 B1 | 12/2001 | Kuo et al. |
| 6,335,874 B1 | 1/2002 | Eitan |
| 6,335,990 B1 | 1/2002 | Chen et al. |
| 6,337,502 B1 | 1/2002 | Eitan et al. |
| 6,339,556 B1 | 1/2002 | Watanabe |
| 6,343,033 B1 | 1/2002 | Parker |
| 6,344,959 B1 | 2/2002 | Milazzo |
| 6,346,442 B1 | 2/2002 | Aloni et al. |
| 6,348,381 B1 | 2/2002 | Jong |
| 6,348,711 B1 | 2/2002 | Eitan |
| 6,351,415 B1 | 2/2002 | Kushnarenko |
| 6,353,356 B1 | 3/2002 | Liu |
| 6,353,554 B1 | 3/2002 | Banks |
| 6,353,555 B1 | 3/2002 | Jeong |
| 6,356,062 B1 | 3/2002 | Elmhurst et al. |
| 6,356,469 B1 | 3/2002 | Roohparvar et al. |
| 6,359,501 B2 | 3/2002 | Lin et al. |
| 6,374,337 B1 | 4/2002 | Estakhri |
| 6,385,086 B1 | 5/2002 | Mihara et al. |
| 6,396,741 B1 | 5/2002 | Bloom et al. |
| 6,400,209 B1 | 6/2002 | Matsuyama et al. |
| 6,400,607 B1 | 6/2002 | Pasotti et al. |
| 6,407,537 B2 | 6/2002 | Antheunis |
| 6,410,388 B1 | 6/2002 | Kluth et al. |
| 6,417,081 B1 | 7/2002 | Thurgate |
| 6,418,506 B1 | 7/2002 | Pashley et al. |
| 6,426,898 B1 | 7/2002 | Mihnea et al. |
| 6,429,063 B1 | 8/2002 | Eitan |
| 6,433,624 B1 | 8/2002 | Grossnickle et al. |
| 6,436,766 B1 | 8/2002 | Rangarajan et al. |
| 6,436,768 B1 | 8/2002 | Yang et al. |
| 6,438,031 B1 | 8/2002 | Fastow |
| 6,438,035 B2 | 8/2002 | Yamamoto et al. |
| 6,440,797 B1 | 8/2002 | Wu et al. |
| 6,442,074 B1 | 8/2002 | Hamilton et al. |
| 6,445,030 B1 | 9/2002 | Wu et al. |
| 6,448,750 B1 | 9/2002 | Shor et al. |
| 6,449,188 B1 | 9/2002 | Fastow |
| 6,449,190 B1 | 9/2002 | Bill |
| 6,452,438 B1 | 9/2002 | Li |
| 6,455,896 B1 | 9/2002 | Chou et al. |
| 6,456,528 B1 | 9/2002 | Chen |
| 6,456,533 B1 | 9/2002 | Hamilton et al. |
| 6,456,539 B1 | 9/2002 | Nguyen et al. |
| 6,458,656 B1 | 10/2002 | Park et al. |
| 6,458,677 B1 | 10/2002 | Hopper et al. |
| 6,468,861 B2 | 10/2002 | Iijima |
| 6,469,929 B1 | 10/2002 | Kushnarenko et al. |
| 6,469,935 B2 | 10/2002 | Hayashi |
| 6,472,706 B2 | 10/2002 | Widdershoven et al. |
| 6,477,084 B1 | 11/2002 | Eitan |
| 6,477,085 B1 | 11/2002 | Kuo |
| 6,490,204 B2 | 12/2002 | Bloom et al. |
| 6,496,414 B2 | 12/2002 | Kasa et al. |
| 6,504,756 B2 | 1/2003 | Gonzalez et al. |
| 6,510,082 B1 | 1/2003 | Le et al. |
| 6,512,701 B1 | 1/2003 | Hamilton et al. |
| 6,519,180 B2 | 2/2003 | Tran et al. |
| 6,519,182 B1 | 2/2003 | Derhacobian et al. |
| 6,522,585 B2 | 2/2003 | Pasternak |
| 6,525,969 B1 | 2/2003 | Kurihara et al. |
| 6,528,390 B2 | 3/2003 | Komori et al. |
| 6,529,412 B1 | 3/2003 | Chen et al. |
| 6,532,173 B2 | 3/2003 | Iioka et al. |
| 6,535,020 B1 | 3/2003 | Yin |
| 6,535,434 B2 | 3/2003 | Maayan et al. |
| 6,537,881 B1 | 3/2003 | Rangarajan et al. |
| 6,538,270 B1 | 3/2003 | Randolph et al. |
| 6,541,816 B2 | 4/2003 | Ramsbey et al. |
| 6,552,387 B1 | 4/2003 | Eitan |
| 6,555,436 B2 | 4/2003 | Ramsbey et al. |
| 6,559,500 B2 | 5/2003 | Torii |
| 6,562,683 B1 | 5/2003 | Wang et al. |
| 6,566,194 B1 | 5/2003 | Ramsbey et al. |
| 6,566,699 B2 | 5/2003 | Eitan |
| 6,567,303 B1 | 5/2003 | Hamilton et al. |
| 6,567,312 B1 | 5/2003 | Torii et al. |

| | | |
|---|---|---|
| 6,567,316 B1 | 5/2003 | Ohba et al. |
| 6,570,211 B1 | 5/2003 | He et al. |
| 6,574,139 B2 | 6/2003 | Kurihara |
| 6,577,514 B2 | 6/2003 | Shor et al. |
| 6,577,532 B1 | 6/2003 | Chevallier |
| 6,577,547 B2 | 6/2003 | Ukon |
| 6,583,005 B2 | 6/2003 | Hashimoto et al. |
| 6,583,007 B1 | 6/2003 | Eitan |
| 6,583,479 B1 | 6/2003 | Fastow et al. |
| 6,584,017 B2 | 6/2003 | Maayan et al. |
| 6,590,811 B1 | 7/2003 | Hamilton et al. |
| 6,593,606 B1 | 7/2003 | Randolph et al. |
| 6,594,181 B1 | 7/2003 | Yamada |
| 6,608,526 B1 | 8/2003 | Sauer |
| 6,608,905 B1 | 8/2003 | Muza et al. |
| 6,614,052 B1 | 9/2003 | Zhang |
| 6,614,295 B2 | 9/2003 | Tsuchi |
| 6,614,686 B1 | 9/2003 | Kawamura |
| 6,614,690 B2 | 9/2003 | Roohparvar |
| 6,614,692 B2 | 9/2003 | Maayan et al. |
| 6,617,179 B1 | 9/2003 | Kim |
| 6,617,215 B1 | 9/2003 | Halliyal et al. |
| 6,618,290 B1 | 9/2003 | Wang et al. |
| 6,624,672 B2 | 9/2003 | Confaloneri et al. |
| 6,627,555 B2 | 9/2003 | Eitan et al. |
| 6,630,384 B1 | 10/2003 | Sun et al. |
| 6,633,496 B2 | 10/2003 | Maayan et al. |
| 6,633,499 B1 | 10/2003 | Eitan et al. |
| 6,633,956 B1 | 10/2003 | Mitani |
| 6,636,440 B2 | 10/2003 | Maayan et al. |
| 6,639,271 B1 | 10/2003 | Zheng et al. |
| 6,639,837 B2 | 10/2003 | Takano et al. |
| 6,639,844 B1 | 10/2003 | Liu et al. |
| 6,639,849 B2 | 10/2003 | Takahashi et al. |
| 6,642,148 B1 | 11/2003 | Ghandehari et al. |
| 6,642,573 B1 | 11/2003 | Halliyal et al. |
| 6,642,586 B2 | 11/2003 | Takahashi |
| 6,643,170 B2 | 11/2003 | Huang et al. |
| 6,643,177 B1 | 11/2003 | Le et al. |
| 6,643,178 B2 | 11/2003 | Kurihara |
| 6,643,181 B2 | 11/2003 | Sofer et al. |
| 6,645,801 B1 | 11/2003 | Ramsbey et al. |
| 6,649,972 B2 | 11/2003 | Eitan |
| 6,650,568 B2 | 11/2003 | Iijima |
| 6,653,190 B1 | 11/2003 | Yang et al. |
| 6,653,191 B1 | 11/2003 | Yang et al. |
| 6,654,296 B2 | 11/2003 | Jang et al. |
| 6,664,588 B2 | 12/2003 | Eitan |
| 6,665,769 B2 | 12/2003 | Cohen et al. |
| 6,670,241 B1 | 12/2003 | Kamal et al. |
| 6,670,669 B1 | 12/2003 | Kawamura |
| 6,674,138 B1 | 1/2004 | Halliyal et al. |
| 6,677,805 B2 | 1/2004 | Shor et al. |
| 6,680,509 B1 | 1/2004 | Wu et al. |
| 6,686,242 B2 | 2/2004 | Willer et al. |
| 6,690,602 B1 | 2/2004 | Le et al. |
| 6,693,483 B2 | 2/2004 | Deml et al. |
| 6,700,818 B2 | 3/2004 | Shappir et al. |
| 6,717,207 B2 | 4/2004 | Kato |
| 6,723,518 B2 | 4/2004 | Papsidero et al. |
| 6,731,542 B1 | 5/2004 | Le et al. |
| 6,738,289 B2 | 5/2004 | Gongwer et al. |
| 6,744,692 B2 | 6/2004 | Shiota et al. |
| 6,765,259 B2 | 7/2004 | Kim |
| 6,768,165 B1 | 7/2004 | Eitan |
| 6,781,876 B2 | 8/2004 | Forbes et al. |
| 6,788,579 B2 | 9/2004 | Gregori et al. |
| 6,791,396 B2 | 9/2004 | Shor et al. |
| 6,794,249 B2 | 9/2004 | Palm et al. |
| 6,794,280 B2 | 9/2004 | Chang |
| 6,798,699 B2 | 9/2004 | Mihnea et al. |
| 6,818,956 B2 | 11/2004 | Kuo et al. |
| 6,829,172 B2 | 12/2004 | Bloom et al. |
| 6,831,872 B2 | 12/2004 | Matsuoka |
| 6,836,431 B2 | 12/2004 | Chang |
| 6,839,280 B1 | 1/2005 | Chindalore et al. |
| 6,859,028 B2 | 2/2005 | Toner |
| 6,870,772 B1 | 3/2005 | Nitta et al. |
| 6,871,258 B2 | 3/2005 | Micheloni et al. |
| 6,885,585 B2 | 4/2005 | Maayan et al. |
| 6,885,590 B1 | 4/2005 | Zheng et al. |
| 6,906,357 B1 | 6/2005 | Vashchenko et al. |
| 6,912,160 B2 | 6/2005 | Yamada |
| 6,917,541 B2 | 7/2005 | Shimbayashi et al. |
| 6,917,544 B2 | 7/2005 | Maayan et al. |
| 6,928,001 B2 | 8/2005 | Avni et al. |
| 6,930,928 B2 | 8/2005 | Liu et al. |
| 6,937,521 B2 | 8/2005 | Avni |
| 6,937,523 B2 | 8/2005 | Eshel |
| 6,954,393 B2 | 10/2005 | Lusky et al. |
| 6,967,872 B2 | 11/2005 | Quader et al. |
| 6,967,896 B2 | 11/2005 | Eisen et al. |
| 6,977,410 B2 | 12/2005 | Naso et al. |
| 6,981,188 B2 | 12/2005 | Galzur et al. |
| 6,996,692 B2 | 2/2006 | Kouno |
| 7,043,672 B2 | 5/2006 | Merritt |
| 7,079,420 B2 | 7/2006 | Shappir et al. |
| 7,105,099 B2 | 9/2006 | Chung et al. |
| 7,115,525 B2 | 10/2006 | Abatchev et al. |
| 7,116,577 B2 | 10/2006 | Eitan |
| 7,125,763 B1 | 10/2006 | Sobek et al. |
| 7,177,227 B2 | 2/2007 | Petti et al. |
| 2001/0006477 A1 | 7/2001 | Banks |
| 2002/0004878 A1 | 1/2002 | Norman |
| 2002/0004921 A1 | 1/2002 | Muranaka et al. |
| 2002/0064911 A1 | 5/2002 | Eitan |
| 2002/0101765 A1 | 8/2002 | Mihnea et al. |
| 2002/0132436 A1 | 9/2002 | Eliyahu et al. |
| 2002/0140109 A1 | 10/2002 | Keshavarzi et al. |
| 2002/0145465 A1 | 10/2002 | Shor et al. |
| 2002/0191465 A1 | 12/2002 | Maayan et al. |
| 2002/0199065 A1 | 12/2002 | Subramoney et al. |
| 2003/0001213 A1 | 1/2003 | Lai |
| 2003/0021155 A1 | 1/2003 | Yachareni et al. |
| 2003/0072192 A1 | 4/2003 | Bloom et al. |
| 2003/0076710 A1 | 4/2003 | Sofer et al. |
| 2003/0100153 A1 | 5/2003 | Kunori |
| 2003/0117841 A1 | 6/2003 | Yamashita |
| 2003/0131186 A1 | 7/2003 | Buhr |
| 2003/0134476 A1 | 7/2003 | Roizin et al. |
| 2003/0142544 A1 | 7/2003 | Maayan et al. |
| 2003/0145176 A1 | 7/2003 | Dvir et al. |
| 2003/0145188 A1 | 7/2003 | Cohen et al. |
| 2003/0155659 A1 | 8/2003 | Verma et al. |
| 2003/0160280 A1* | 8/2003 | Yoshino .................... 257/324 |
| 2003/0190786 A1 | 10/2003 | Ramsbey et al. |
| 2003/0197221 A1 | 10/2003 | Shinozaki et al. |
| 2003/0202411 A1 | 10/2003 | Yamada |
| 2003/0206435 A1 | 11/2003 | Takahashi |
| 2003/0208663 A1 | 11/2003 | Van Buskirk et al. |
| 2003/0209767 A1 | 11/2003 | Takahashi et al. |
| 2003/0214844 A1 | 11/2003 | Iijima |
| 2003/0214852 A1 | 11/2003 | Chang |
| 2003/0218207 A1 | 11/2003 | Hashimoto et al. |
| 2003/0218913 A1 | 11/2003 | Le et al. |
| 2003/0222303 A1 | 12/2003 | Fukuda et al. |
| 2003/0227796 A1 | 12/2003 | Miki et al. |
| 2004/0007730 A1 | 1/2004 | Chou et al. |
| 2004/0012993 A1 | 1/2004 | Kurihara |
| 2004/0013000 A1 | 1/2004 | Torii |
| 2004/0014280 A1 | 1/2004 | Willer et al. |
| 2004/0014290 A1 | 1/2004 | Yang et al. |
| 2004/0017717 A1 | 1/2004 | Morishima |
| 2004/0021172 A1 | 2/2004 | Zheng et al. |
| 2004/0027858 A1 | 2/2004 | Takahashi et al. |
| 2004/0117395 A1 | 6/2004 | Gong et al. |

| | | | | | | |
|---|---|---|---|---|---|---|
| 2004/0136236 | A1 | 7/2004 | Cohen | JP | 2001-156189 | 6/2001 |
| 2004/0151034 | A1 | 8/2004 | Shor et al. | JP | 2002-216488 | 8/2002 |
| 2004/0153621 | A1 | 8/2004 | Polansky et al. | JP | 3358663 | 10/2002 |
| 2004/0157393 | A1 | 8/2004 | Hwang | WO | WO 81/00790 | 3/1981 |
| 2004/0222437 | A1 | 11/2004 | Avni et al. | WO | WO 96/15553 | 5/1996 |
| 2005/0058005 | A1 | 3/2005 | Shappir et al. | WO | WO 96/25741 | 8/1996 |
| 2005/0068806 | A1 | 3/2005 | Hurst et al. | WO | WO 98/03977 | 1/1998 |
| 2005/0078026 | A1 | 4/2005 | Cai | WO | WO 99/31670 | 6/1999 |
| 2005/0078528 | A1 | 4/2005 | Tsang et al. | WO | WO 99/57728 | 11/1999 |
| 2005/0117395 | A1 | 6/2005 | Maayan et al. | WO | WO 00/46808 | 8/2000 |
| 2005/0117601 | A1 | 6/2005 | Anderson et al. | WO | WO 01/65566 | 9/2001 |
| 2005/0140405 | A1 | 6/2005 | Do et al. | WO | WO 01/65567 | 9/2001 |
| 2005/0164451 | A1* | 7/2005 | Ogura et al. ............ 438/257 | WO | WO 01/84552 | 11/2001 |
| 2005/0213593 | A1 | 9/2005 | Anderson et al. | WO | WO 02/43073 | 5/2002 |
| 2005/0232024 | A1 | 10/2005 | Atir et al. | WO | WO 03/032393 | 4/2003 |
| 2006/0015691 | A1 | 1/2006 | Louie et al. | WO | WO 03/036651 | 5/2003 |
| 2006/0084219 | A1 | 4/2006 | Lusky et al. | WO | WO 03/054964 | 7/2003 |
| 2006/0126382 | A1 | 6/2006 | Maayan et al. | WO | WO 03/063167 | 7/2003 |
| 2006/0126383 | A1 | 6/2006 | Shappir et al. | WO | WO 03/063168 | 7/2003 |
| 2006/0216923 | A1 | 9/2006 | Tran et al. | WO | WO 03/079370 | 9/2003 |
| 2006/0281266 | A1 | 12/2006 | Wells | WO | WO 03/079446 | 9/2003 |
| | | | | WO | WO 03/083916 | 10/2003 |
| | | | | WO | WO 03/088258 | 10/2003 |
| | | | | WO | WO 03/088259 | 10/2003 |
| | | | | WO | WO 03/088260 | 10/2003 |
| | | | | WO | WO 03/088261 | 10/2003 |
| | | | | WO | WO 03/088353 | 10/2003 |
| | | | | WO | WO 03/100790 | 12/2003 |

FOREIGN PATENT DOCUMENTS

| | | |
|---|---|---|
| EP | 0751560 | 6/1995 |
| EP | 0693781 | 1/1996 |
| EP | 0 822 557 | 2/1998 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1 091 418 | 4/2001 |
| EP | 1126468 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1324343 | 7/2003 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |
| JP | 54125938 | 9/1979 |
| JP | 58094199 U | 6/1983 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 04-291962 | 10/1992 |
| JP | 05021758 | 1/1993 |
| JP | 05-326893 | 12/1993 |
| JP | 06151833 | 5/1994 |
| JP | 06-232416 | 8/1994 |
| JP | 07193151 | 7/1995 |
| JP | 08-106791 | 4/1996 |
| JP | 08-297988 | 11/1996 |
| JP | 09-017981 | 1/1997 |
| JP | 09162314 | 6/1997 |
| JP | 10-055691 | 2/1998 |
| JP | 10-106276 | 4/1998 |
| JP | 10-199263 | 7/1998 |
| JP | 10-228784 | 8/1998 |
| JP | 10-228786 | 8/1998 |
| JP | 10 334676 | 12/1998 |
| JP | 11-162182 | 6/1999 |
| JP | 11-219593 | 8/1999 |
| JP | 11-354758 | 12/1999 |
| JP | 2000-315392 | 11/2000 |
| JP | 2001-085646 | 3/2001 |
| JP | 2001-118392 | 4/2001 |

OTHER PUBLICATIONS

U.S. Appl. No. 08/902,890, filed Jul. 30, 1997, Eitan.
U.S. Appl. No. 11/489,327, filed Jul. 18, 2006, Eitan et al.
U.S. Appl. No. 11/440,624, filed May 24, 2006, Lusky et al.
U.S. Appl. No. 11/489,747, filed Jul. 18, 2006, Bloom et al.
U.S. Appl. No. 11/336,093, filed Jan. 20, 2006, Eitan et al.
Bude et al., EEPROM/Flash Sub 3.0V drain—Source Bias Hot Carrier Writing, IEDM, 1995, pp. 989-992.
Bude et al., Secondary Electron Flash—a High Performance, Low Power Flash Technology for 0.35 um and below, IEDM, 1997, 279-282.
Bude et al., Modeling Nonequilibrium Hot Carrier Device Effects, Conference of Insulator Specialists of Europe, Jun. 1997, Sweden.
Jung et al., IEEE Journal of Solid-State Circuits, Nov. 1996, 1575-1583, vol. 31, No. 11.
Campardo et al., IEEE Journal of Solid-State Circuits, Nov. 2000, 1655-1667, vol. 35, No. 11.
Lin et al., Novel Source-Controlled Self-Verified Programming for Multilevel EEPROM's, IEEE Transactions on Electron Devices, Jun. 2000, 1166-1174, vol. 47, No. 6.
Chan et al., A True Single-Transistor Oxide-Nitride-Oxide EEPROM Device, IEEE Electron Device Letters, Mar. 1987, vol. EDL-8, No. 3.
Eitan et al., "Hot-Electron Injection into the Oxide in n-Channel MOS Devices", IEEE Transactions on Electron Devices, vol. ED-28, No. 3, pp. 328-370, Mar. 1981.
Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.
Tanaka et al., "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373.
Ma et al., A Dual-bit Split-Gate EEPROM (DSG) Cell in Contactless Array for Single-Vcc High Density Flash Memories, IEEE, 1994, 57-60.
Oshima et al., Process and Device Technologies for 16Mbit EPROMs with Large-Tilt-Angle Implanted P-Pocket Cell, IEEE, Dec. 1990, Ch. 2865-4/90/0000-0095, pp. 5 2 1-5 2 4, San Francisco, California.
Lee, A new approach for the floating-gate MOS nonvolatile memory, Applied Physics Letters, Oct. 1977, 475-476, vol. 31, No. 7, American Institute of Physics.

Glasser et al., MOS Device Electronics, The Design and Analysis of VLSI Circuits, Chapter 2, 67-163, 1998, Addison-Wesley Publishing Company.

Bhattacharyya et al., FET Gate Structure for Nonvolatile N-Channel Read-Mostly Memory Device, IBM Technical Disclosure Bulletin, Nov. 1975, 1768, vol. 18, No. 6.

Ricco et al., Nonvolatile Multilevel Memories for Digital Applications, Dec. 1998, 2399-2421, vol. 86, No. 12, Institute of Electrical and Electronics Engineers, Inc.

Martin, Improved Circuits for the Realization of Switched-Capacitor Filters, IEEE Transactions on Circuits and Systems, Apr. 1980, 237-244, vol. CAS-27.

Tseng et al., "Thin CVD Stacked Gate Dielectric for ULSI Technology", IEEE, pp. 321-214; 1993, 13.1.1-13.1.4.

Pickar, Ion Implantation in Silicon—Physics, Processing, and Microelectronic Devices, Applied Solid State Science, 1975, 151-241, vol. 5, Academic Press.

2 Bit/Cell EEPROM Cell Using Band-To-Band Tunneling for Data Read-Out, IBM Technical Disclosure Bulletin, 1992, 136-140, vol. 35 No. 4B.

Umezawa, et al., A 5-V-Only Operation 0.6-µm Flash EEPROM with Row Decoder Scheme in Triple-Well Structure, IEEE Journal of Solid-State Circuits, 1992, 1540, vol. 27.

Mitchell, et al., A new self-aligned planar array cell for ultra high density EPROMS, 1987.

Esquivel, et al., High Density Contactless, Self Aligned EPROM Cell Array Technology, 1986.

Johns, Martin, Analog Integrated Circuit Design, Jun. 1, 1997, Chapter 10, John Wiley and Sons Inc.

Allen, et al., CMOS Analog Circuit Design, 2002, 259pages, Oxford University Press.

Klinke, et al., A very-high-slew-rate CMOS operational amplifier, IEEE Journal of Solid-State Circuits, 1989, 744-746, 24 vol.

Shor, et al, paper WA2.04.01—Self regulated Four phased charge pump with boosted wells, ISCAS 2002.

Fotouhi, An efficient CMOS line driver for 1.544-Mb/s T1 and 2.048-Mb/s E1 applications, IEEE Journal of Solid-State Circuits, 2003, 226-236pages, 38vol.

P-N Junction Diode, Physics of semiconductor devices, 1981, ch. 2, "A Wiley-Interscience Publication", John Wiley & Sons Publishers.

Chang, Non Volatile Semiconductor Memory Devices, Proceedings of the IEEE, 64 vol., No. 7 , pp. 1039-1059; Jul. 1976.

Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.

4 Bits of Digital Data Fit in a Single Cell, Technology Newsletter, Electronic Design, Apr. 1, 1996.

M. Specht et al, Novel Dual Bit Tri- Gate Charge Trapping Memory Devices, IEEE Electron Device Letters, vol. 25, No. 12, Dec. 2004, pp. 810-812.

"Design Considerations in Scaled SONOS Nonvolatile Memory Devices" Bu, Jiankang et al. , Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.

"SONOS Nonvolatile Semiconductor Memories for Space and Military Applications", Adams et al., Symposium, 2000. http://klabs.org/richcontent/MemoryContent/nvmt_symp/nvmts_2000/papers/adams_d.pdf.

"Philips Research—Technologies—Embedded Nonvolatile Memories" http://research.philips.com/technologies/ics/nvmemories/index.html.

"Semiconductor Memory: Non-Volatile Memory (NVM)", National University of Singapore, Department of Electrical and Computer Engineering: http://ece.nus.edu.sg/stfpage/elezhucx/myweb/NVM.pdf.

"Saifun Non-Volatile Memory Technology", 1st Edition, 2005, published and written by Saifun Semiconductors Ltd. 1110 pgs.

European Search Report 06100524.5, May 16, 2006.

European Search Report 06100507.0, Mar. 28, 2007.

European Search Report 04791843.8, Feb. 13, 2007.

Lee et al., Scalable 2-bit silicon-oxide-nitride-oxide-silicon (SONOS) memory with physically separated local nitrides under a merged gate, Solid State Electronics 48 (2004), pp. 1771-1775.

Mahapatra et al. , CHISEL Flash EEPROM—Part I: Performance and Scaling; IEEE Transactions on Electron Devices, vol. 49. No. 7, Jul. 2002.

Mohapatra et al., CHISEL Programming Operation of Scaled NOR Flash EEPROMs—Effect of Voltage Scaling, Device Scaling and Technological Parameters IEEE Transactions on Electron Devices, vol. 50. No. 10, Oct. 2003.

* cited by examiner (Fig. 6, Step 602)

(Fig. 6, Step 604)

(Fig. 6, Step 606)

(Fig. 6, step 608)

(Fig. 6, step 610)

(Fig. 6, step 612)

(Fig. 6, step 614)

(Fig. 6, step 616)

(Fig. 6, step 618)

(Fig. 6, step 620)

(Fig. 6, step 622)

(Fig. 6, step 624)

(Fig. 6, step 626)

(Fig. 6, step 628)

(Fig. 6, step 630)

(Fig. 6, step 632)

(Fig. 6, step 634)

(Fig. 6, step 636)

DOUBLE DENSITY NROM WITH NITRIDE STRIPS (DDNS)

CROSS-REFERENCE(S) TO RELATED APPLICATION(S)

This application is a continuation-in-part application claiming benefit from U.S. patent application No. 11/489,237, filed Jul. 18, 2006 which is hereby incorporated by reference.

This application claims the benefit of U.S. Provisional Application No. 60/777,114, filed Feb. 28, 2006, the entire disclosure of which is incorporated herein by reference.

TECHNICAL FIELD

The disclosure relates to techniques for fabricating semiconductor devices and, more particularly, to nitride read only memory (NROM) or other microelectronic cells or structures.

BACKGROUND

The Field Effect Transistor

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals.

The terminals of a field effect transistor (PET) are commonly named source, gate and drain. In the FET a small amount of voltage is applied to the gate in order to control current flowing between the source and drain. In FETs the main current appears in a narrow conducting channel formed near (usually primarily under) the gate. This channel connects electrons from the source terminal to the drain terminal. The channel conductivity can be altered by varying the voltage applied to the gate terminal, enlarging or constricting the channel and thereby controlling the current flowing between the source and the drain.

FIG. 1 illustrates a FET 100 comprising a p-type substrate, and two spaced-apart n-type diffusion areas—one of which will serve as the "source", the other of which will serve as the "drain" of the transistor. The space between the two diffusion areas is the "channel". A thin dielectric layer is disposed over the substrate in the neighborhood of the channel, and a "gate" structure is disposed over the dielectric layer atop the channel. (The dielectric under the gate is also commonly referred to as "gate oxide" or "gate dielectric".) Electrical connections (not shown) may be made to the source, the drain, and the gate. The substrate may be grounded.

Generally, when there is no voltage on the gate, there is no electrical conduction (connection) between the source and the drain. As voltage (of the correct polarity) is applied to the gate, there is a "field effect" in the channel between the source and the drain, and current can flow between the source and the drain, and can be controlled by the voltage applied to the gate. In this manner, a small signal (gate voltage) can control a relatively large signal (current flow between the source and the drain).

The Floating Gate Transistor

A floating gate transistor is generally a transistor structure, broadly based on the FET, as described hereinabove. As illustrated in FIG. 2, the floating gate transistor 200 has a source and a drain, but rather than having only one gate, it has two gates which are called control gate (CG) and floating gate (FG). It is this arrangement of control gate and floating gate which enables the floating gate transistor to function as a memory cell, as described hereinbelow.

The floating gate is disposed over tunnel oxide (comparable to the gate oxide of the FET). The floating gate is a conductor, the tunnel oxide is an insulator (dielectric material). Another layer of oxide (interpoly oxide, also a dielectric material) separates the floating gate from the control gate.

Since the floating gate is a conductor, and is surrounded by dielectric material, it can store a charge. Electrons can move around freely within the conductive material of the floating gate (which comports with the basic definition of a "conductor").

Since the floating gate can store a charge, it can exert a field effect on the channel region between the source and the drain, in a manner similar to how a normal FET works, as described hereinabove. Mechanisms for storing charges on the floating gate structure, as well as removing charges from the floating gate are described hereinbelow.

Generally, if a charge is stored on the floating gate, this represents a binary "1". If no charge is stored on the floating gate, this represents a binary "0". (These designations are arbitrary, and can be reversed so that the charged state represents binary "0" and the discharged state represents binary "1".) That represents the programming "half" of how a floating gate memory cell operates. The other half is how to determine whether there is a charge stored on the floating gate—in other words, to "read" the memory cell. Generally, this is done by applying appropriate voltages to the source, drain and gate terminals, and determining how conductive the channel is. Some modes of operation for a floating gate memory cell are described hereinbelow.

Normally, the floating gate non-volatile memory (NVM) cell has only a single "charge-storing area"—namely, the conductive floating gate (FG) structure, and can therefore only store a single bit of information (binary "1" or binary "0"). More recently, using a technology referred to as "multi-level cell" (MLC), two or more bits can be stored in and read from the floating gate cell.

The NROM Memory Cell

Another type of memory cell, called a "nitride, read only memory" (NROM) cell, has a charge-storage structure which is different from that of the floating gate memory cell and which permits charges to be stored in two separate charge-storage areas. Generally, the two separate charge storage areas are located within a non-conductive layer disposed between the gate and the underlying substrate, such as a layer of nitride formed in an oxide-nitride-oxide (ONO) stack underneath the gate. The non-conductive layer acts as a charge-trapping medium. Generally, electrical charges will stay where they are put in the charge-trapping medium, rather than being flee to move around as in the example of the conductive floating gate of the floating gate memory cell. A first bit of binary information (binary "1" or binary "0") can be stored in a first portion (such as the left-hand side) of the charge-trapping medium, and a second bit of binary information (binary "1" or binary "0") can be stored in a second portion (such as the right-hand side) of the charge-trapping medium. An alternative viewpoint is that different charge concentrations can be considered for each bit of storage.

Using MLC technology, at least two bits can be stored in and read from each of the two portions (charge storage areas) of the charge-trapping medium (for a total of 4 bits), similarly 3 bits or more than 4 bits may be identified.

FIG. 3 illustrates a basic NROM memory cell, which may be viewed as an FET with an "ONO" structure inserted between the gate and the substrate. (One might say that the ONO structure is "substituted" for the gate oxide of the FET.)

The ONO structure is a stack (or "sandwich") of bottom (lower) oxide 322, a charge-trapping material such as nitride 324, and a top (upper) oxide 326. The ONO structure may have an overall thickness of approximately 10-25 nm, such as 18 nm, as follows:

the bottom oxide layer 322 may be from 3 to 6 nm, for example 4 nm thick;

the middle nitride layer 324 may be from 3 to 8 nm, for example 4 nm thick; and the top oxide layer 326 may be from 5 to 15 nm, for example 10 nm thick.

The NROM memory cell has two spaced apart diffusions 314 and 316 (which can function as source and drain, as discussed hereinbelow), and a channel region 320 defined in the substrate between the two diffusion regions 314 and 316.

In FIG. 3, the diffusions are labeled "N+". This means that they are regions in the substrate that have been doped with an electron donor material, such as phosphorous or arsenic. These diffusions are typically created in a larger region which is p-type cell well (CW) is doped with boron (or indium or both). This is the normal "polarity" for a NVM cell employing electron injection (but which may also employ hole injection, such as for erase). With opposite polarity (boron or indium implants in a n-type cell well), the primary injection mechanism would be for holes, which is generally accepted to be not as effective as electron injection. One skilled in the art will recognize that the concepts disclosed herein can be applied to opposite polarity devices.

The charge-trapping material 324 is non-conductive, and therefore, although electrical charges can be stored in the charge-trapping material, they are not free to move around, they will generally stay where they are stored. Nitride is a suitable charge-trapping material. Charge trapping materials other than nitride may also be suitable for use as the charge-trapping medium. One such material is silicon dioxide with buried polysilicon islands. A layer (324) of silicon dioxide with polysilicon islands would be sandwiched between the two layers of oxide (322) and (326). Alternatively, the charge-trapping layer 324 may be constructed by implanting an impurity, such as arsenic, into a layer of silicon dioxide deposited on top of the bottom oxide 322.

The memory cell 300 is generally capable of storing at least two bits of data—at least one bit(s) in a first storage area of the nitride layer 324 represented by the dashed circle 323, and at least one bit(s) in a second storage area of the nitride layer 324 represented by the dashed circle 321. Thus, the NROM memory cell can be considered to comprise two "half cells", each half cell capable of storing at least one bit(s). It should be understood that a half cell is not a physically separate structure from another half cell in the same memory cell. The term "half cell", as it may be used herein, is used herein only to refer to the "left" or "right" bit storage area of the ONO stack (nitride layer). The storage areas 321, 323 may variously be referred to as "charge storage areas", "charge trapping areas", and the like, throughout this document. (The two charge storage areas may also be referred to as the right and left "bits".)

Each of the storage areas 321, 323 in the charge-trapping material 324 can exert a field effect on the channel region 320 between the source and the drain, in a manner similar to how a normal FET works, as described hereinabove (FIG. 2).

Generally, if a charge is stored in a given storage area of the charge-trapping material, this represents a binary "1", and if no charge is stored in a given storage area of the charge-trapping material, this represents a binary "0". (Again, these designations are arbitrary, and can be reversed to that the charged state represents binary "0" and the discharged state represents binary "1",) That represents the programming "half" of how an NROM memory cell operates. The other half is how to determine whether there is a charge stored in a given storage area of the charge-trapping material—in other words, to "read" the memory cell. Generally, this is done by applying appropriate voltages to the diffusion regions (functioning as source and drain) and gate terminals, and determining how conductive the channel is.

Generally, one feature of NROM cells is that rather than performing "symmetrical" programming and reading, NROM cells are beneficially programmed and read "asymmetrically", which means that programming and reading occur in opposite directions. The arrows labeled in FIG. 3 are arranged to illustrate this point. Programming may be performed in what is termed the "forward" direction and reading may be performed in what is termed the "opposite" or "reverse" direction.

"Reading" an NROM Cell

Reading an NROM memory cell may involve applying voltages to the terminals of the memory cell comparable to those used to read a floating gate memory cell, but reading may be performed in a direction opposite to that of programming. Generally, rather than performing "symmetrical" programming and reading (as is the case with the floating gate memory cell, described hereinabove), the NROM memory cell is usually programmed and read "asymmetrically", meaning that programming and reading occur in opposite directions. This is illustrated by the arrows in FIG. 3. Programming is performed in what is termed the forward direction and reading is performed in what is termed the opposite or reverse direction. For example, generally, to program the right storage area 323 (in other words, to program the right "bit"), electrons flow from left (source) to right (drain). To read the right storage area 323 (in other words, to read the right "bit"), voltages are applied to cause electrons to flow from right to left, in the opposite or reverse direction. For example, generally, to program the left storage area 321 (in other words, to program the left "bit".), electrons flow from right (source) to left (drain). To read the left storage area 321 (in other words, to read the left "bit"), voltages are applied to cause electrons to flow from left to right, in the opposite or reverse direction. See, for example, U.S. Pat. No. 6,768,165.

Memory Array Architecture, Generally

Memory arrays are well known, and comprise a plurality (many, including many millions) of memory cells organized (including physically arranged) in rows (usually represented in drawings as going across the page, horizontally, from left-to-right) and columns (usually represented in drawings as going up and down the page, from top-to-bottom).

As discussed hereinabove, each memory cell comprises a first diffusion (functioning as source or drain), a second diffusion (functioning as drain or source) and a gate, each of which has to receive voltage in order for the cell to be operated, as discussed hereinabove. Generally, the first diffusions (usually designated "source") of a plurality of memory cells are connected to a first bit line which may be designated "BL(n)", and second diffusions (usually designated "drain") of the plurality of memory cells are connected to a second bit line which may be designated "BL(n+1)". Typically, the gates of a plurality of memory cells are connected to common word lines (WL).

The bitlines may be "buried bitline" diffusions in the substrate, and may serve as the source/drain diffusions for the memory cells. The wordlines may be polysilicon structures and may serve as the gate elements for the memory cells.

FIG. 4 illustrates an array of NROM memory cells (labeled "a" through "i") connected to a number of word lines (WL) and bit lines (BL). For example, the memory cell "e" has its gate connected to WL(n), its source (left hand diffusion) is connected to BL(n), and its drain (right hand diffusion) is connected to BL(n+1). The nine memory cells illustrated in FIG. 4 are exemplary of many millions of memory cells that may be resident on a single chip.

Notice, for example that the gates of the memory cells "e" and "f" (to the right of "e") are both connected to the same word line WL(n). (The gate of the memory cell "d" to the left of "e" is also connected to the same word line WL(n).) Notice also that the right hand terminal (diffusion) of memory cell "e" is connected to the same bit line BL(n+1) as the left-hand terminal (diffusion) of the neighboring memory cell "f". In this example, the memory cells "e" and "f" have two of their three terminals connected together.

The situation of neighboring memory cells sharing the same connection—the gates of neighboring memory cells being connected to the same word line, the source (for example, right hand diffusion) of one cell being connected to the drain (for example left hand diffusion) of the neighboring cell—is even more dramatically evident in what is called "virtual ground architecture" wherein two neighboring cells actually share the same diffusion. In virtual ground array architectures, the drain of one memory cell may actually be the same diffusion which is acting as the source for its neighboring cell. Examples of virtual ground array architecture may be found in U.S. Pat. Nos. 5,650,959; 6,130,452; and 6,175,519, incorporated in their entirety by reference herein.

Secondary Injection, and Managing Far From Junction Injection

Generally, NVM cells (both floating gate and ONO-based) are programmed by injecting electrons into the charge storage medium, such as the conductive floating gate of a floating gate memory cell, or the bit storage areas of the charge trapping layer (typically nitride) of an ONO-based memory cell.

A common mechanism for injecting electrons is channel hot electron (CHE) injection. Generally, in order to implement CHE injection of electrons into the charge storage medium, the source may be grounded, the drain may be set to a positive voltage (which will "attract" electrons from the source, laterally across the channel region), and the gate is also set to a positive voltage (which will "attract" electrons vertically through the tunnel oxide or bottom oxide of the ONO, into the charge storage medium). As electrons flow through the channel from source to drain, some of the electrons will make their way through the tunnel oxide (of floating gate) or bottom oxide (of ONO) and become stored in the charge storage medium. This injection of electrons into the charge storage medium increases the threshold voltage of the memory cell. The threshold voltage (Vt) of the memory cell can later be measured, or "read".

The NROM cell can store charges in two separate (sometimes referred to as "left" and "right") bit storage regions 321 and 323 of the charge-trapping layer 324. Depending on which bit (storage region) is desired to be programmed, the left and right diffusion regions 314 and 316 can act as source and drain, or as drain and source. The left and right bit storage areas are generally above and adjacent to the respective left and right diffusion regions (or "junctions"). The gate always functions as the gate.

It is important to manage the injection of electrons in an NROM cell, so that (for example) when programming the right bit, most of the electrons are injected into the right bit storage region (and conversely, when programming the left bit, most of the electrons are injected into the left bit storage region). Else, there can be effects resulting from "far from junction" electrons, discussed hereinbelow. With CHE programming, the situation is generally well characterized (under control).

A byproduct of CHE injection of electrons in NVM memory cells can be what is called "secondary injection", or "secondary electron injection", and may be abbreviated "SEI".

Generally, the "primary" channel electrons (e1), as they accelerate from source to drain, impact valence electrons in the channel, next to the drain, ionizing valence elections in the substrate, and resulting in the generation (creation) of electron/hole pairs (e2/h2). The generated electrons e2 may be collected by the drain. However, the generated holes h2 may accelerate towards the low substrate potential Vb of the substrate, back under the channel region. Within the substrate, another impact ionization may occur, this time between holes h2 and valence electrons, creating another electron/hole pair e3/h3. Holes h3 are pulled further into substrate, and are generally of no concern. However, electrons e3, called secondary electrons, may be accelerated towards the positive gate potential Vg of the gate and, if they have gained sufficient energy, they can be injected into the charge storage medium.

The generation and injection of secondary electrons can be of great benefit to a floating gate memory cell, but generally causes problems for an NROM memory cell, because it has proven itself to be difficult to control—electrons injected far from the junction cause problems with reading, and retention.

The phenomenon of the generation of secondary electrons and problems associated with their injection into the charge storage areas (see 321, 323, FIG. 3) of NROM memory cells has been well recognized. The following commonly-owned patents are specifically referenced:

U.S. Pat. No. 6,429,063 (filed Mar. 6, 2000), entitled NROM Cell With Generally Decoupled Primary and Secondary Injection (hereinafter referred to as the '063 patent), and U.S. Pat. No. 6,583,007 (filed Dec. 20, 2001), entitled Reducing Secondary Injection Effects (hereinafter referred to as the '007 patent).

The '063 patent, for example, discloses techniques for decoupling injection of channel hot electrons into a charge trapping layer of an NROM cell from injection of non-channel (secondary) elections into the charge trapping layer, as well as for minimizing the generation of the non-channel (secondary) electrons. As disclosed therein, secondary injection reduces the performance of NROM cells because secondary electrons are injected far from the bit line junctions. These secondary electrons are not removable during erasure and thus, reduce the ability of the NROM cell to separate between the two charge storage areas.

The '007 patent, for example, discloses methods and apparatus for managing and reducing effects of secondary injection in non-volatile memory (NVM) devices that have a non-conducting charge trapping layer, such as NROM devices, and also discloses methods and apparatus for preventing punch-through voltages from detrimentally affecting erase operations in the NVM device that has a non-conducting charge trapping layer.

The problem of far from junction injection can occur with both CHE injection and secondary injection of electons, and boils down to non-localization of charge in the ONO nitride layer (324).

The solutions set forth in the '063 and '007 patents are exemplary of techniques for trying to control the injection point of secondary and hot electron injection. However, the charge location is difficult to control since the injection of hot and secondary electrons can have a wide distribution ("wide" equates with "far from junction").

Another, what one might deem "obvious" solution, is to physically separate the nitride charge storage layer (324) into two pieces, strips, or stripes. Such a physical solution, of course, involves elaborate processing steps to accomplish and, if it takes up more space, may tend to be self-defeating (generally speaking, there would be limited benefit to making a memory cell perform better, if it needs to be larger).

A technique for decreasing charge distribution and diffusion during and after CHE injection is discussed in *Scalable 2-bit silicon-oxide-nitride-oxide-silicon (SONOS) memory with physically separated local nitrides under a merged gate*, Lee et al., (Samsung), Solid State Electronics 48 (2004), pp 1771-1775, incorporated by reference in its entirety herein. Generally, the nitride layer (the whole ONO stack) is formed in two distinct sections (may be referred to as "strips", or "stripes"), rather than as one single planar structure, under the gate. Although the "brute force" approach discussed in the article may provide good 2 bit separation (for either CHE or SEI), it is a complicated process which may result in a non-uniform (thickness and characteristics) ONO stack.

Commonly-owned patents disclose structure and operation of NROM and related ONO memory cells. Some examples may be found in commonly-owned U.S. Pat. Nos. 5,768,192 and 6,011,725, 6,649,972 and 6,552,387.

Commonly-owned patents disclose architectural aspects of an NROM and related ONO array, (some of which have application to other types of NVM array) such as segmentation of the array to handle disruption in its operation, and symmetric architecture and non-symmetric architecture for specific products, as well as the use of NROM and other NVM array(s) related to a virtual ground array. Some examples may be found in commonly-owned U.S. Pat. Nos. 5,963,465, 6,285,574 and 6,633,496.

Commonly-owned patents also disclose additional aspects at the architecture level, including peripheral circuits that may be used to control an NROM array or the like. Some examples may be found in commonly-owned U.S. Pat. Nos. 6,233,180, and 6,448,750.

Commonly-owned patents also disclose several methods of operation of NROM and similar arrays, such as algorithms related to programming, erasing, and/or reading such arrays. Some examples may be found in commonly-owned U.S. Pat. Nos. 6,215,148, 6,292,394 and 6,477,084.

Commonly-owned patents also disclose manufacturing processes, such as the process of forming a thin nitride layer that traps hot electrons as they are injected into the nitride layer. Some examples may be found in commonly-owned U.S. Pat. Nos. 5,966,603, 6,030,871, 6,133,095 and 6,583,007.

Commonly-owned patents also disclose algorithms and methods of operation for each segment or technological application, such as: fast programming methodologies in all flash memory segments, with particular focus on the data flash segment, smart programming algorithms in the code flash and EEPROM segments, and a single device containing a combination of data flash, code flash and/or EEPROM. Some examples may be found in commonly-owned U.S. Pat. Nos. 6,954,393 and 6,967,896.

A more complete description of NROM and similar ONO cells and devices, as well as processes for their development may be found at "Non Volatile Memory Technology", 2005 published by Saifun Semiconductor and materials presented at and through http://siliconnexus.com, both incorporated by reference herein in their entirety.

GLOSSARY

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

anisotropic literally, one directional. An example of an anisotropic process is sunbathing. Only surfaces of the body exposed to the sun become tanned. (see "isotropic").

bit The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte, and the basic unit for 128 Bytes to 16K Bytes is treated as a "page". That is the "mathematical" definition of "bit". In some cases, the actual (physical) left and right charge storage areas of a NROM cell are conveniently referred to as the left "bit" and the right "bit", even though they may store more than one binary bit (with MLC, each storage area can store at least two binary bits). The intended meaning of "bit" (mathematical or physical) should be apparent from the context in which it is used.

bit line or bitline (BL). A conductor connected to (or which may actually be) the drain (or source) of a memory cell transistor.

byte A byte is commonly used as a unit of storage measurement in computers, regardless of the type of data being stored. It is also one of the basic integral data types in many programming languages. A byte is a contiguous sequence of a fixed number of binary bits. In recent years, the use of a byte to mean 8 bits is nearly ubiquitous. The unit is sometimes abbreviated to "B". Terms for large quantities of Bytes can be formed using the standard range of prefixes, e.g., kilobyte (KB), megabyte (MB) and gigabyte (GB).

cap a term used to describe layers of a material disposed over another, dissimilar material, typically to protect the underlying material from damage during subsequent processing steps. A cap may be left in place, or removed, depending upon the situation.

Cell Well (CW) the cell well is an area in the silicon substrate that is prepared for functioning as a transistor or memory cell device by doping with an electron acceptor material such as boron or indium (p, electron acceptors or holes) or with an electron donor material such as phosphorous or arsenic (n, electron donors). The depth of a cell well is defined by the depth of the dopant distribution.

CHEI short for channel hot electron injection. sometimes abbreviated "CHE".

CHISEL short for channel initiated secondary electron.

CMOS short for complementary metal oxide semiconductor. CMOS consists of n-channel and p-channel MOS transistors. Due to very low power consumption and dissipation as well minimization of the current in "off" state CMOS is a very effective device configuration for implementation of digital functions. CMOS is a key device in state-of-the-art silicon microelectronics.

CMOS Inverter: A pair of two complementary transistors (a p-channel and an n-channel) with the source of the n-channel transistor connected to the drain of the p-channel one and the gates connected to each other. The output (drain of the p-channel transistor) is high whenever the input (gate) is low and the other way round. The CMOS inverter is the basic building block of CMOS digital circuits.

NMOS: n-channel CMOS.

PMOS: p-channel CMOS.

CMP short for chemical-mechanical polishing. CMP is a process, using both chemicals and abrasives, comparable to lapping, for removing material from a built up structure, resulting in a particularly planar resulting structure.

Dopant element introduced into semiconductor to establish either p-type (acceptors) or n-type (donors) conductivity; common dopants in silicon: p-type, boron, B, Indium, In; n-type phosphorous, P, arsenic, As, antimony, Sb.

EEPROM short for electrically erasable, programmable read only memory. EEPROMs have the advantage of being able to selectively erase any part of the chip without the need to erase the entire chip and without the need to remove the chip from the circuit. The minimum erase unit is 1 Byte and more typically a full Page. While an erase and rewrite of a location appears nearly instantaneous to the user, the write process is usually slightly slower than the read process; the chip can usually be read at full system speeds.

EPROM short for erasable, programmable read only memory. EPROM is a memory cell in which information (data) can be erased and replaced with new information (data).

Erase a method to erase data on a large set of bits in the array, by applying voltage scheme that inject holes or remove electrons in the bit set. This method causes all bits to reach a low Vt level.

FET short for field effect transistor. The FET is a transistor that relies on an electric field to control the shape and hence the conductivity of a "channel" in a semiconductor material. FETs are sometimes used as voltage-controlled resistors. The terminals of FETs are called gate, drain and source.

Flash memory Flash memory is a form of non-volatile memory (EEPROM) that can be electrically erased and reprogrammed. Flash memory architecture allows multiple memory locations to be erased or written in one programming operation.

FN tunneling Field emission—also called Fowler-Nordheim tunneling—is the process whereby electrons tunnel through a barrier in the presence of a high electric field. This quantum mechanical tunneling process is an important mechanism for thin barriers as those in metal-semiconductor junctions on highly-doped semiconductors. Using FN tunneling, electrons can be moved to the floating gate of a MOSFET memory cell.

half cell this term is sometimes used to refer to the two distinct charge storage areas (left and right bits) of an NROM memory cell.

HHI short for hot hole injection isotropic literally, identical in all directions. An example of an isotropic process is dissolving a tablet in water. All exposed surfaces of the tablet are uniformly acted upon. (see "anisotropic")

mask a layer of material which is applied over an underlying layer of material, and patterned to have openings, so that the underlying layer can be processed where there are openings. After processing the underlying layer, the mask may be removed. Common masking materials are photoresist and nitride. Nitride is usually considered to be a "hard mask".

MLC short for multi-level cell. In the context of a floating gate (FG) memory cell, MLC means that at least two bits of information can be stored in the memory cell. In the context of an NROM memory cell, MLC means that at least four bits of information can be stored in the memory cell—at least two bits in each of the two charge storage areas.

MOS short for metal oxide semiconductor.

MOSFET short for metal oxide semiconductor field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs).

nitride commonly used to refer to silicon nitride (chemical formula $Si_3N_4$). A dielectric material commonly used in integrated circuit manufacturing. Forms an excellent mask (barrier) against oxidation of silicon (Si). Nitride is commonly used as a hard mask or, in the case of a NVM memory cell having an ONO layer as a charge-trapping material.

n-type semiconductor in which concentration of electrons is higher than the concentration of "holes". See p-type.

NROM short for nitride read only memory.

NVM short for non-volatile memory. NVM is computer memory that can retain the stored information even when not powered. Examples of non-volatile memory include read-only memory, flash memory, most types of magnetic computer storage devices (e.g. hard disks, floppy disk drives, and magnetic tape), optical disc drives, and early computer storage methods such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations which make it unsuitable for use as primary storage. Typically non-volatile memory either costs more or performs worse than volatile random access memory. (By analogy, the simplest form of a NVM memory cell is a simple light switch. Indeed, such a switch can be set to one of two (binary) positions, and "memorize" that position.)

ONO short for oxide-nitride-oxide. ONO is used as a charge storage insulator consisting of a sandwich of thermally insulating oxide, and charge-trapping nitride.

oxide commonly used to refer to silicon dioxide ($SiO_2$). Also known as silica. $SiO_2$ is the most common insulator in semiconductor device technology, particularly in silicon MOS/CMOS where it is used as a gate dielectric (gate oxide); high quality films are obtained by thermal oxidation of silicon. Thermal $SiO_2$ forms a smooth, low-defect interface with Si, and can be also readily deposited by CVD. Some particular applications of oxide are:

LV Oxide short for low voltage oxide. LV refers to the process used to deposit the oxide.

HV Oxide short for high voltage oxide. HV refers to the process used to deposit the oxide STI Oxide short for shallow trench oxide. Oxide-filled trenches are commonly used to separate one region (or device) of a semiconductor substrate from another region (or device).

Poly short for polycrystalline silicon (Si). Heavily doped poly Si is commonly used as a gate contact in silicon MOS and CMOS devices;

p-type semiconductor in which concentration of "holes" is higher than the concentration of electrons. See n-type. Examples of p-type silicon include silicon doped (enhanced) with boron (B), Indium (In) and the like.

Program a method to program a memory cells, or half cells, typically by applying a voltage scheme that injects electrons to increase the Vt of the cells or half cells being programmed.

PROM short for programmable read-only memory.

RAM short for random access memory. RAM refers to data storage formats and equipment that allow the stored data to be accessed in any order—that is, at random, not just in sequence. In contrast, other types of memory devices (such as magnetic tapes, disks, and drums) can access data on the storage medium only in a predetermined order due to constraints in their mechanical design.

Read a method to read the digital data stored in a memory cell.

resist short for photoresist. also abbreviated "PR". Photoresist is often used as a masking material in photolithographic processes to reproduce either a positive or a negative image on a structure, prior to etching (removal of material which is not masked). PR is usually washed off after having served its purpose as a masking material.

ROM short for read-only memory.

SEI short for secondary electron injection (or simply "secondary injection"). SEI occurs as a result of impact ionization by CHE electrons (e1) near the drain diffusion, generating an electron-hole pair (e2-h2), the hole (h2) of which continues into the substrate whereat another impact ionization results in another electron-hole pair (e3-h3), and the e3 electron becomes injected into the charge storage area(s) of the memory cell.

Si Silicon, a semiconductor.

SLC short for single level cell. In the context of a floating gate (FG) memory cell, SLC means that one bit of information can be stored in the memory cell. In the context of an NROM memory cell, SLC means that at least two bits of information can be stored in the memory cell.

SONOS Si-Oxide-Nitride-Oxide-Si, another way to describe ONO with the Si underneath and the Poly gate on top.

spacer a spacer, as the name implies, is a material (such as a layer of oxide) disposed on an element (such as a poly gate electrode). For example, sidewall spacers disposed on sides of a gate electrode cause subsequent implants to occur further away from the gate than otherwise (without the spacers in place).

STI short for shallow trench isolation

TEHH short for Tunnel Enhanced Hot Hole injection. TEHH is an "injection mechanism".

Units of Length Various units of length may be used herein, as follows:
 meter (m) A meter is the SI unit of length, slightly longer than a yard. 1 meter=~39 inches. 1 kilometer (km)=1000 meters=~0.6 miles. 1,000,000 microns=1 meter. 1,000 millimeters (mm)=1 meter. 100 centimeters (cm)=1 meter.
 micron (μm) one millionth of a meter (0.000001 meter); also referred to as a micrometer.
 mil 1/1000 or 0.001 of an inch; 1 mil=25.4 microns.
 nanometer (nm) one billionth of a meter (0.000000001 meter).
 Angstrom (Å) one tenth of a billionth of a meter. 10 Å=1 nm.

Voltage abbreviated v, or V. A voltage can be positive or negative (or zero). Usually, a negative voltage is preceeded by a minus sign (−). Sometimes a positive voltage is preceeded by a plus sign (+), or no sign at all. A number of voltages are relevant with regard to operating a memory cell, and are typically designated by the capital letter "V", followed by another letter or letters. Some exemplary voltages of interest are:
 KeV short for kilo (thousand) electron volts
 Vt short for threshold voltage
 Vs short for source voltage
 Vd short for drain voltage
 Vg short for gate voltage
 Vbl short for bitline voltage. (the bitline may function as source or drain)
 Vwl short for wordline voltage (which typically is the same as Vg)
 word line or wordline, (WL). A conductor normally connected to the gate of a memory cell transistor. The wordline may actually be the gate electrode of the memory cell.
 write a combined method of first erase a large set of bits, then program a new data into the bit set.

In addition to the above, some abbreviations that may be used herein, or in a provisional application from which this non-provisional application claims priority, include:
 BB short for buried bitline.
 DDNROM short for double density NROM
 DDNS short for double density nitride strips
 DNW short for deep N-well.
 DPP short for dual poly process.
 F short for feature size, which is the minimum size of an element.
 HM short for hard mask.
 HV OX or HV_OX. short for high voltage oxide.
 HV short for high voltage
 IMP short for implant.
 LV short for low voltage
 MV OX short for medium voltage oxide.
 OL short for overlap.
 PHOTO short for photoresist or photomask, depending on the context.
 PI short for pocket implant.
 PO short for poly/oxide.
 poly short for polysilicon.
 PRECLN short for pre-clean.
 PRRM short for photoresist removal
 PT short for punchthrough.
 PWI short for p-well implant
 OPON short for oxide-polysilicon-oxide-nitride

BRIEF DESCRIPTION (SUMMARY)

According to the disclosure, generally, an NVM cell such as an NROM cell is formed using a portion of one ONO stack and an adjacent portion of a neighboring NROM stack. A gate structure is formed between (and atop) the two ONO portions, or "strips" (or "stripes").

According to the disclosure, a method of making a non-volatile memory (NVM) cell comprises: providing an ONO layer comprising a bottom layer of oxide (O), a layer of nitride (N) and a top layer of oxide (O) on a semiconductor substrate; processing the ONO layer to create a number (n) of individual ONO stacks; processing the ONO stacks so as to separate at least the nitride layers of the stacks into two distinct portions; and forming a given memory cell from a portion of one stack and a portion of an adjacent (neighboring) stack. The NVM cell may be an NROM cell. When separating the ONO stacks, the bottom layer of oxide may be left in place.

A nitride mask having openings and an etch process may be used to create the individual ONO stacks. A layer of oxide may be deposited in the openings of the nitride mask, to reduce the size of the openings. And, the openings may be filled with poly. Removing remnants of the nitride mask may leave poly structures having their sidewalls covered by the oxide which was deposited in the openings of the nitride mask. The oxide may be stripped from the sidewalls of the poly structures. A poly liner may be deposited and processed to form poly sidewalls on the poly structures.

According to the disclosure, a method of making a non-volatile memory (NVM) cell comprises: providing an ONO layer comprising a bottom layer of oxide (O), an layer of nitride (N) and a top layer of oxide (O) on a semiconductor substrate; depositing sacrificial layers of material on the ONO layer; processing the ONO layer and sacrificial layers to create a number (n) of individual ONO stacks covered by sacrificial layers; processing the ONO stacks so as to separate each ONO stack into two portions; and forming a given memory cell from a portion of one ONO stack and a portion of an adjacent (neighboring) ONO stack.

According to the disclosure, a non-volatile memory (NVM) cell comprises: an ONO layer disposed on a semiconductor substrate and comprising a plurality (n) of ONO stacks; and for a given memory cell, a gate formed atop a portion of a given ONO stack and an adjacent portion of another ONO stack. Vestiges of a sacrificial poly layer may remain on outer edges of the ONO stacks. The NVM cell may be an NROM cell.

BRIEF DESCRIPTION OF THE DRAWING(S)

Reference will be made in detail to embodiments of the disclosure, examples of which may be illustrated in the accompanying drawing figures (FIGs). The figures are intended to be illustrative, not limiting. Although the disclosure is generally described in the context of these embodiments, it should be understood that it is not intended to limit the disclosure to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199a, 199b, 199c, etc. Such relationships, if any, between similar elements in the same or different figures will become apparent throughout the specification, including, if applicable, in the claims and abstract.

Throughout the descriptions set forth in this disclosure, lowercase numbers or letters may be used, instead of subscripts. For example Vg could be written $V_g$. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "$V_s$" (source voltage) or "$H_2O$" (water). For consistency of font size, such acronyms may be written in regular font, without subscripting, using uppercase and lowercase—for example "Vs" and "H20".

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. Usually, lines in a schematic diagram which cross over one another and there is a dot at the intersection of the two lines are connected with one another, else (if there is no dot at the intersection) they are typically not connected with one another.

DETAILED DESCRIPTION

Figure 1:
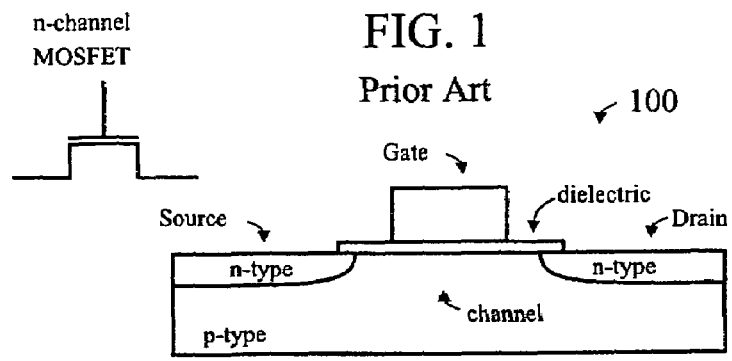
FIG. 1 is a stylized cross-sectional view of a field effect transistor (FET), according to the prior art. To the left of the figure is a schematic symbol for the FET.
Figure 2:
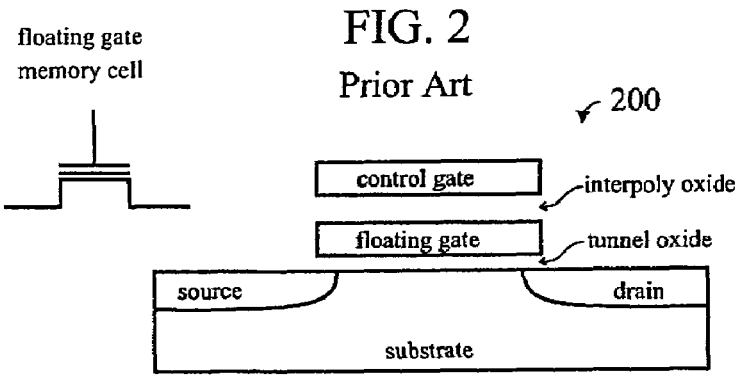
FIG. 2 is a stylized cross-sectional view of a floating gate memory cell, according to the prior art. To the left of the figure is a schematic symbol for the floating gate memory cell.
Figure 3:
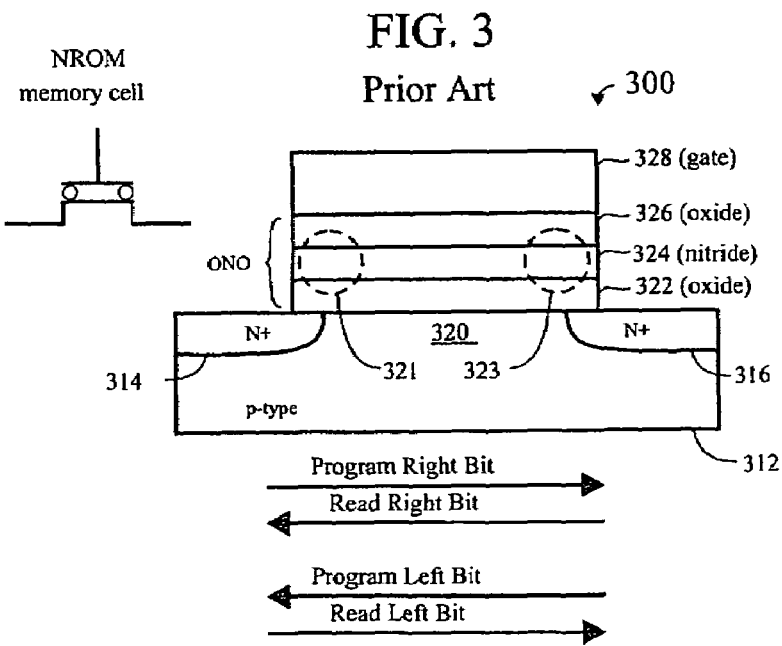
FIG. 3 is a stylized cross-sectional view of a two bit NROM memory cell of the prior art. To the left of the figure is a schematic symbol for the NROM memory cell.
Figure 4:
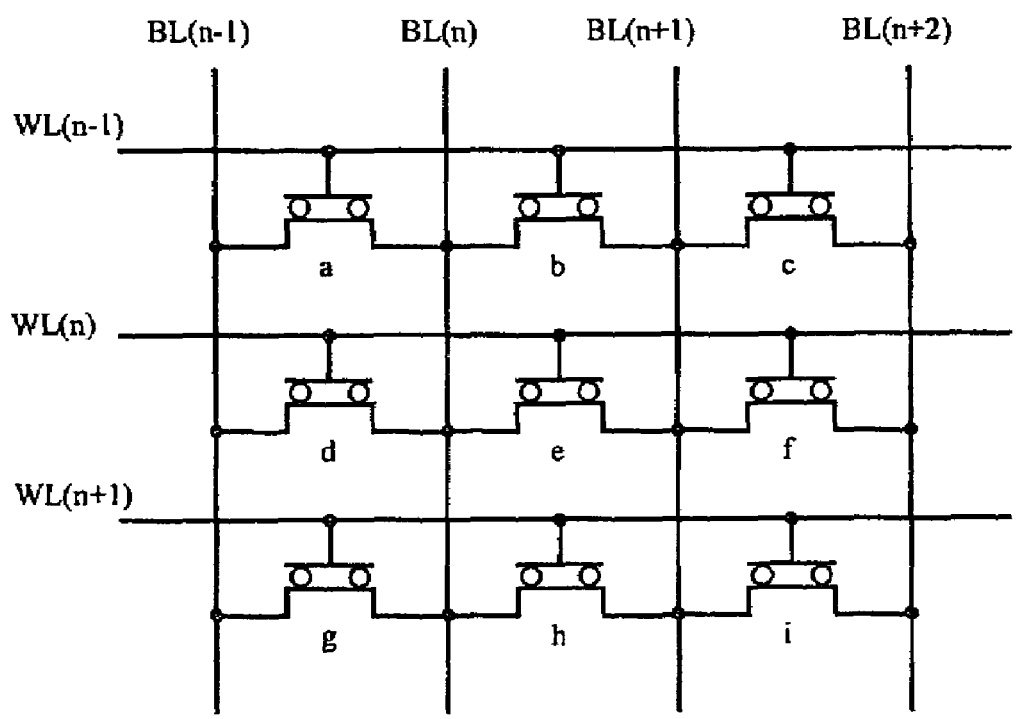
FIG. 4 is a diagram of a memory cell array with NROM memory cells, according to the prior art.

As discussed hereinabove, with reference to FIG. 3, a NVM cell such as the NROM cell comprises two diffusions (which may be buried bitlines in a virtual ground array), a channel defined between the two diffusions, and an ONO (oxide-nitride-oxide) stack disposed above the channel. The nitride layer in the ONO stack is capable of storing electrical charges (such as electrons) in two distinct bit storage areas, generally referred to as the "left" bit storage area 321 and the "right" bit storage area 323. Each of these two storage areas is generally above the one of the two diffusion areas. Due to the physical/electrical properties of the nitride material in the ONO stack (it is a "charge trapping" material, rather than a conductor), charges will generally stay where they are put (initially located).

Generally, the purpose of an "injection mechanism" is to cause electrons to be injected, into the charge storage areas of the NROM cell, and controlled so that when electrons are being injected into a given one of the charge storage areas, the electrons are injected into the charge storage area close to the diffusion, and as few as possible electrons are injected far from the junction. Channel hot electron (CHE) injection of electrons can be fairly well controlled to minimize far-from-junction injection. However, secondary injection of electrons (SIE) is known to be difficult to control, causing undesirable far-from-junction injection. See, for example, U.S. Pat. Nos. 6,429,063 and 6,583,007 for a more detailed discussion of secondary injection in NROM cells.

In a very general sense, one solution to the problem of far-from-junction is to separate the nitride layer of the ONO stack into two strips, separated by (for example) oxide (an insulating material), so that there is no charge-trapping material "far from the junction", and in this manner, problems such as second bit effect and RAC can be minimized or avoided. (As used herein, "far from the junction" means partway across the ONO stack to the other bit storage area. Of course, all the way on the other side of the cell is the other nitride strip.) See, for example, *Scalable 2-bit silicon-oxide-nitride-oxide-silicon (SONOS) memory with physically separated local nitrides under a merged gate*, Lee et al., Solid State Electronics 48 (2004), pp 1771-1775, incorporated by reference herein in its entirety.

Figure 5A:
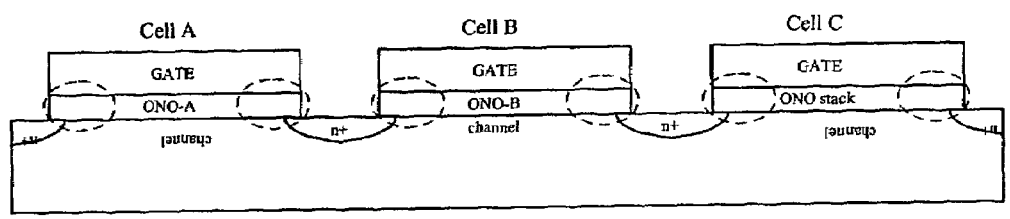
FIG. 5A is a cross-sectional view of three NROM memory cells, according to the prior art.

FIG. 5A shows three ONO-based NVM cells (Cell A, Cell B and Cell C), each having its own ONO stack (ONO-A, ONO-B and ONO-C). The sharing of a diffusion (n+) by two adjacent cells is also illustrated in this figure.

Generally, the process of making an ONO-based NVM cell, such as NROM, starts by laying down the ONO layers, then etching away portions of the top oxide and nitride (often the bottom oxide is left in place, to protect underlying silicon), resulting in a plurality (N) of ONO stacks separated from one another (although the bottom oxide may be continuous across all of the ONO stacks). For example, the width of a given ONO stack may be 13 nm, and the space between adjacent ONO stacks may be 12 nm.

Generally, in the approach suggested by the article ("Scalable 2-bit . . . ") a damascene gate process method is used, which implies that after forming the ONO stacks, a middle portion of the stack is removed, leaving two nitride strips separated by a trench. Then, a modified gate structure is formed atop the two separated nitride strips.

Figure 5B:
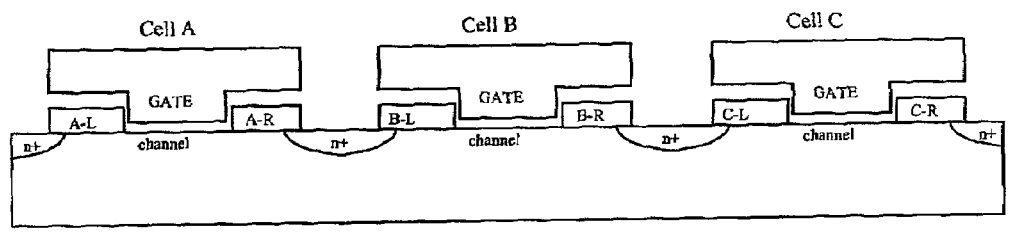
FIG. 5B is a cross-sectional view of three NROM memory cells, according to the prior art.

FIG. 5B illustrates a simplistic approach to forming two nitride strips per memory cell. Generally, each ONO stack is etched, at least through the top oxide and nitride (the bottom oxide may be left in place, or the nitride is etched before the top oxide is applied, resulting in two separate pieces (strips) of nitride per ONO stack, where there used to be one continuous nitride layer (FIG. 5A). For example, ONO-A (FIG. 5A) has been split into ONO A-1 and A-2 (FIG. 5B). For example, ONO-B (FIG. 5A) has been split into ONO B-1 and B-2 (FIG. 5B). For example, ONO-C (FIG. 5A) has been split into ONO C-1 and C-2 (FIG. 5B). There remains the one-to-one correspondence between ONO stacks (such as stack A) and memory cells (such as cell A). In other words, a given ONO stack becomes a given memory cell, in both FIG. 5A and FIG. 5B.

Generally, to achieve an effective result using the technique of FIG. 5B requires needs sub-F lithography (where F is the technology limitation of the lithography capabilities). Samsung (see "Scalable 2-bit . . . " article, above) does it without reverting to sub-F lithography but with a very complex process.

According to this disclosure, a different, less difficult, more effective technique is used to create nitride strips. Generally, the broad purpose is the same as others—namely, having two physically separated charge storage regions in each memory cell. Generally, according to the technique of this disclosure, after the ONO stacks (such as A, B, C) are formed, they are split into two separate strips.

Figure 5C:
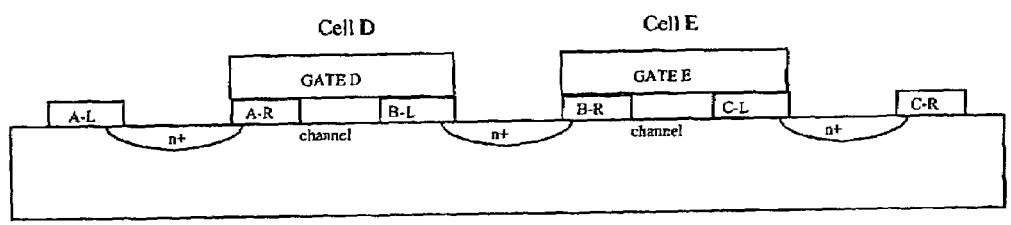
FIG. 5C is a cross-sectional view of three NROM memory cells, according to the disclosure.

FIG. 5C illustrates that ONO stack A has been split into two "halves" (these halves are not each 50% of the stack, they may be less or more than 30% of the stack)—half stack A-L (left half of stack A) and half stack A-R (right half of stack A). Similarly, ONO stack B has been split into two "halves" (these halves are not each 50% of the stack, they may be less or more than 30% of the stack)—half stack B-L (left half of stack B) and half stack B-R (right half of stack B). ONO stack C has been split into two "halves" (these halves are not each 50% of the stack, they may be less or more than 30% of the stack)—half stack C-L (left half of stack C) and half stack C-R (right half of stack C).

A gate (GATE D) is formed atop a right half (such as A-R) of one ONO stack (such as A), and the left half (such as B-L) of an adjacent ONO stack (such as B), thereby forming a cell D. A gate (GATE E) is formed atop a right half (such as B-R) of one ONO stack (such as B), and the left half (such as C-L) of an adjacent ONO stack (such as C), thereby forming a cell E.

Notice that the half stacks A-L and C-R at the end of the "row" of cells are not useful for making a corresponding memory cell. In the illustration of FIG. 5C, one fewer (N−1) cells are formed from an original number (N) of ONO stacks. This would seem to be inefficient, if there were only three ONO stacks to start with, as illustrated, but in the "real world" where there are hundreds or thousands of ONO stacks to start with (N is >100, 1000), the truncating (loss) of the half stacks at the ends of the row is not of serious concern.

There follows a detailed process flow for making NROM memory cells with nitride strips, elaborating greatly on the technique illustrated only very generally in FIG. 5C.

Figure 6:
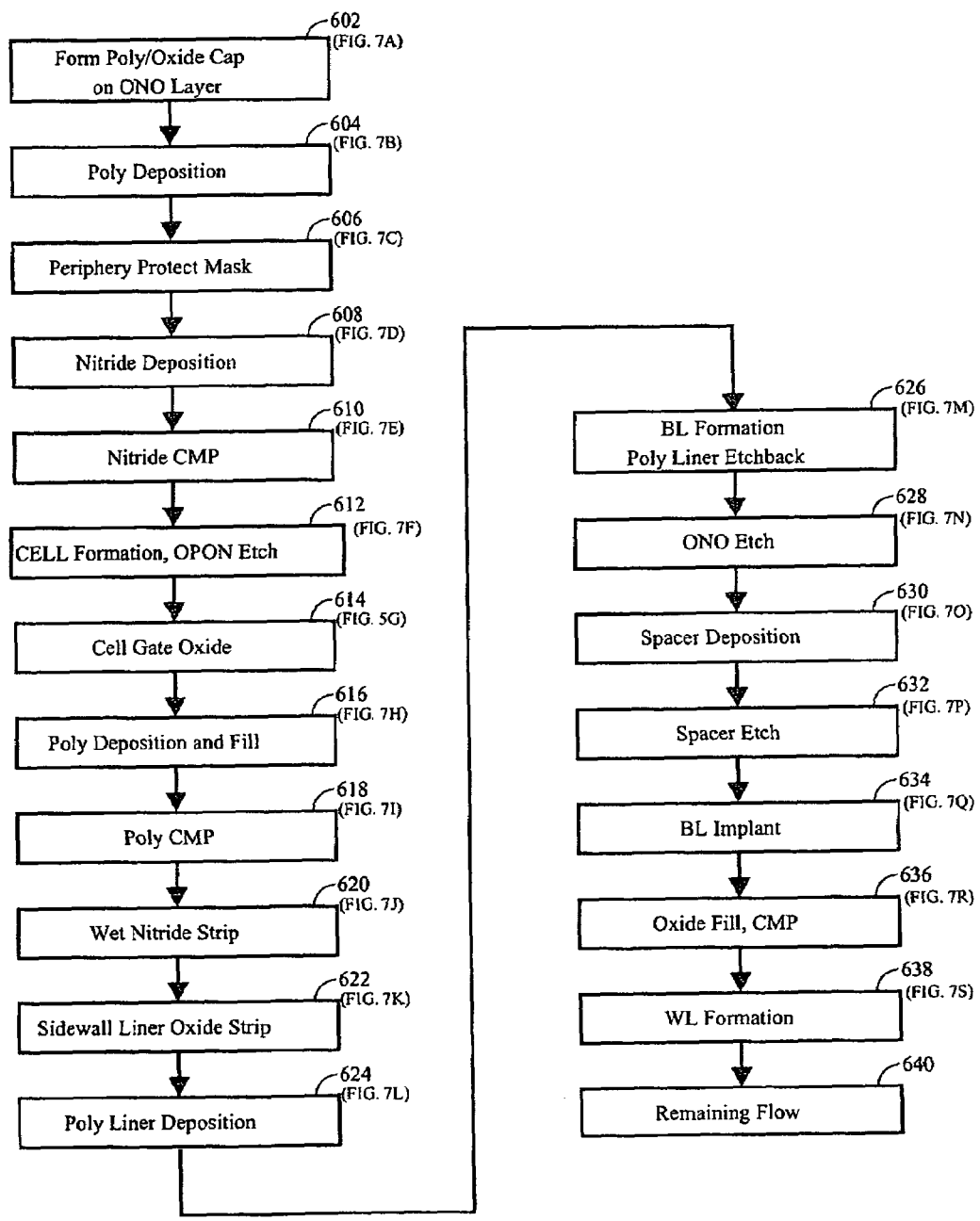
FIG. 6 is a flow diagram illustrating process steps, according to the disclosure.

FIG. 6 is a flow chart illustrating a process flow for forming NROM cells with nitride strips.

Figure 7A:
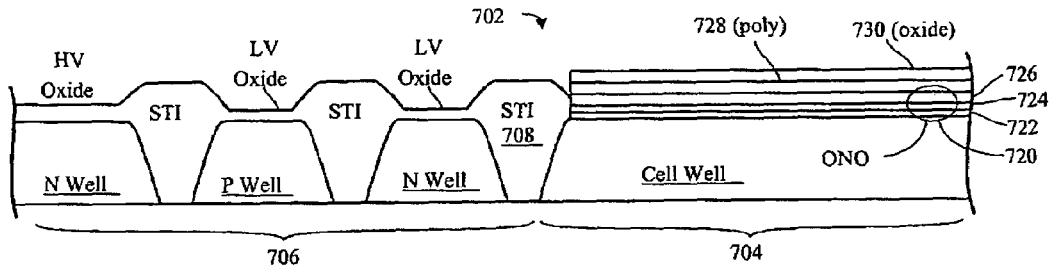
FIGS. 7A-7R are cross-sectional diagrams illustrating an embodiment of NROM cells being fabricated according to the process steps of FIG. 6, according to the disclosure.
Figure 7B:
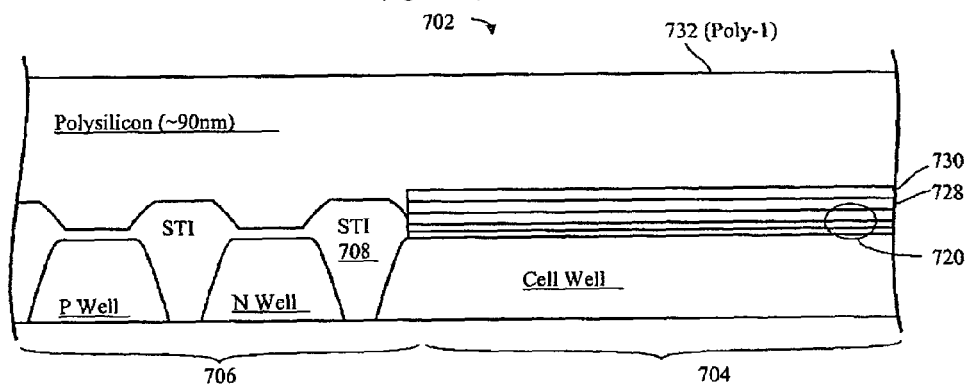
Figure 7C:
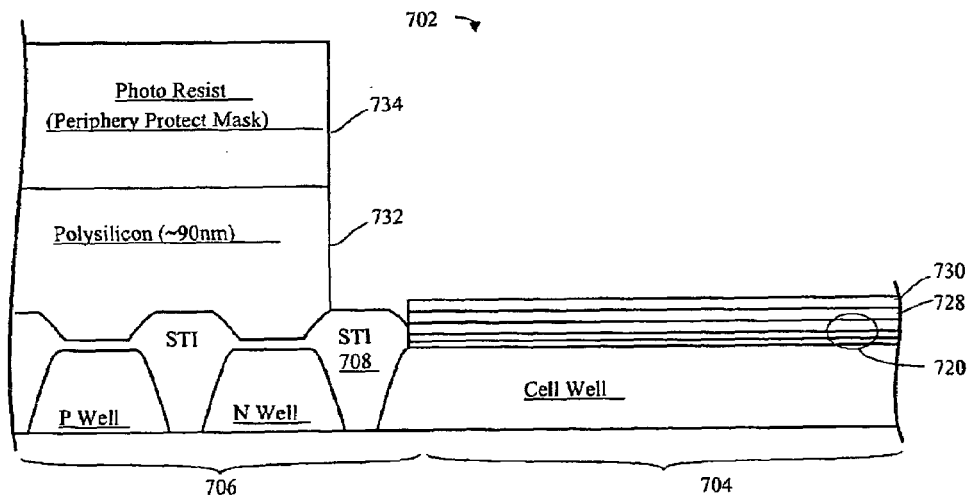
Figure 7D:
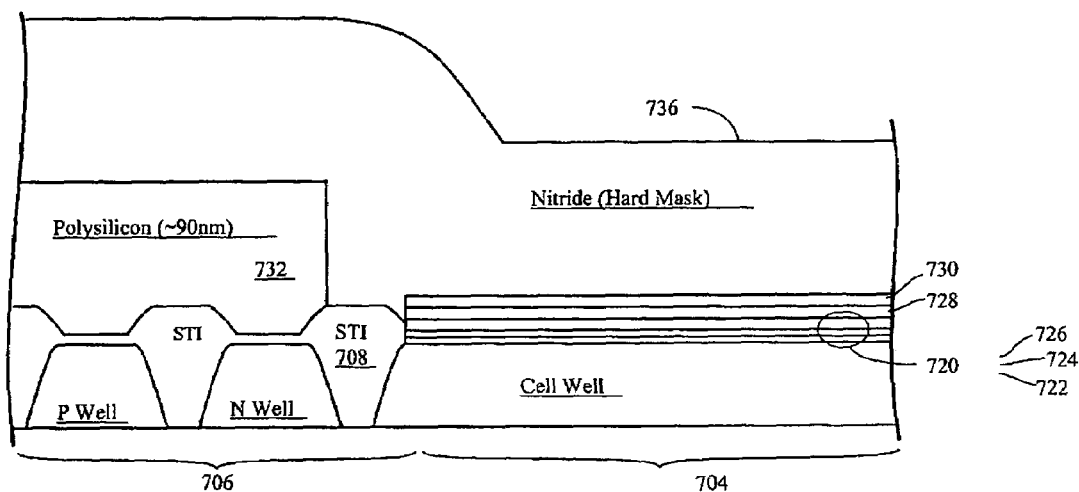
Figure 7E:
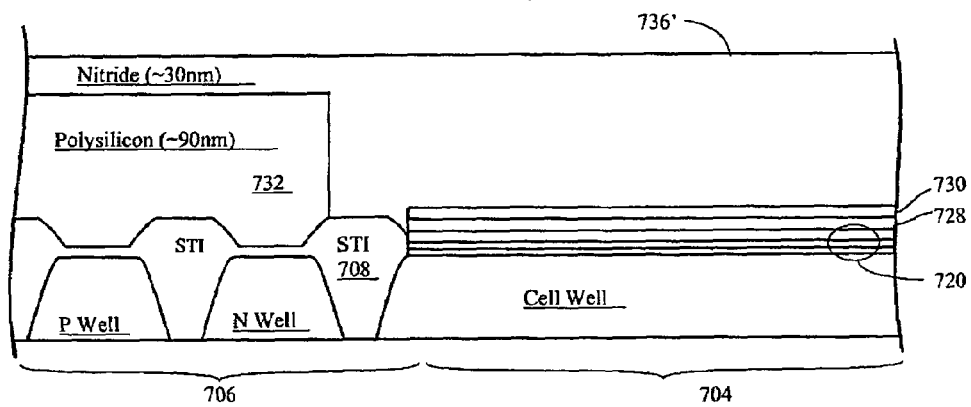
Figure 7F:
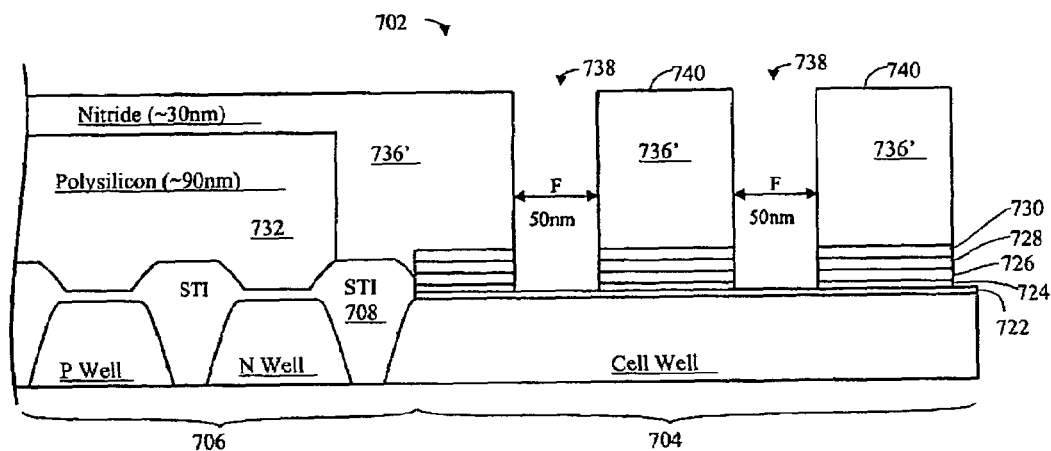
Figure 7G:
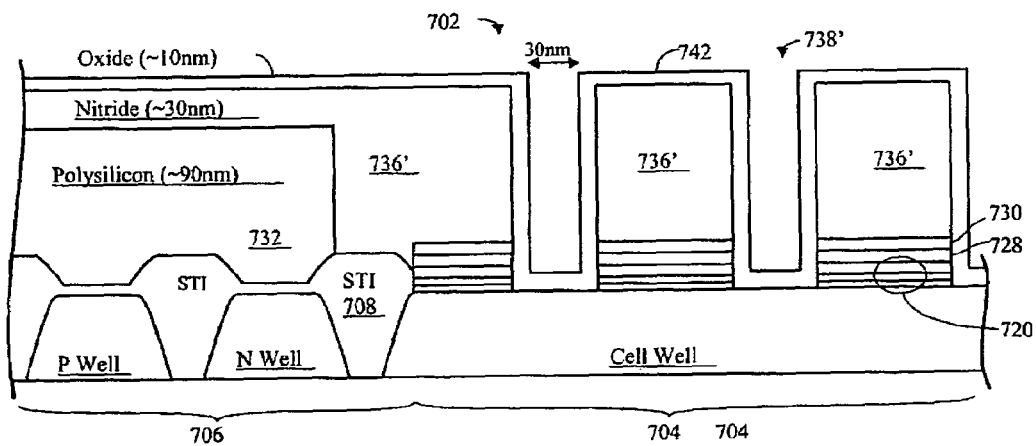
Figure 7H:
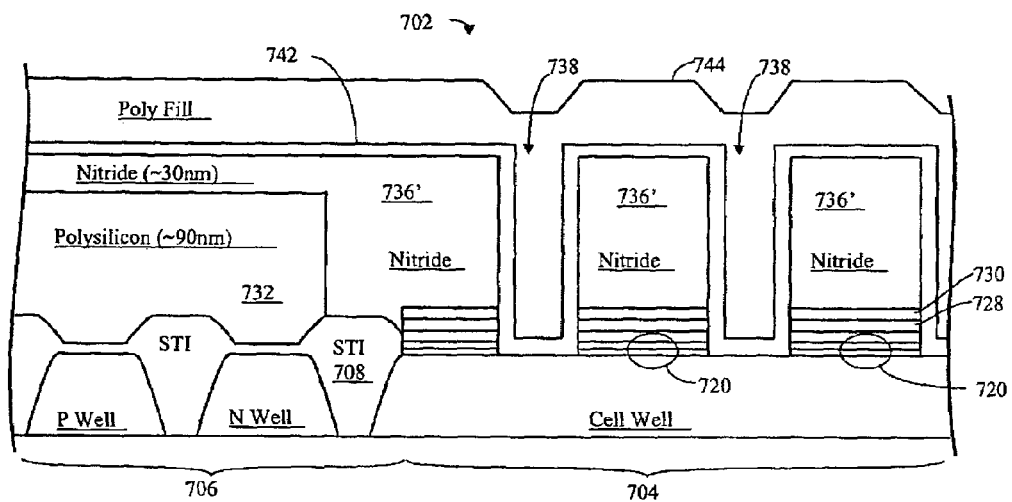
Figure 7I:
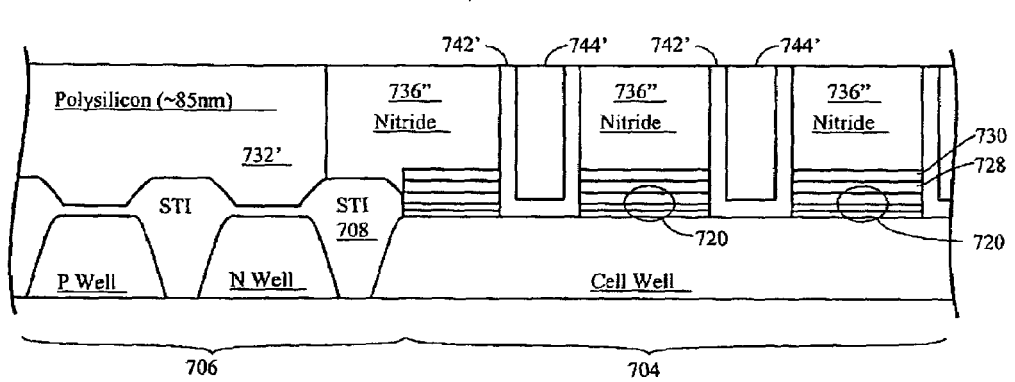
Figure 7J:
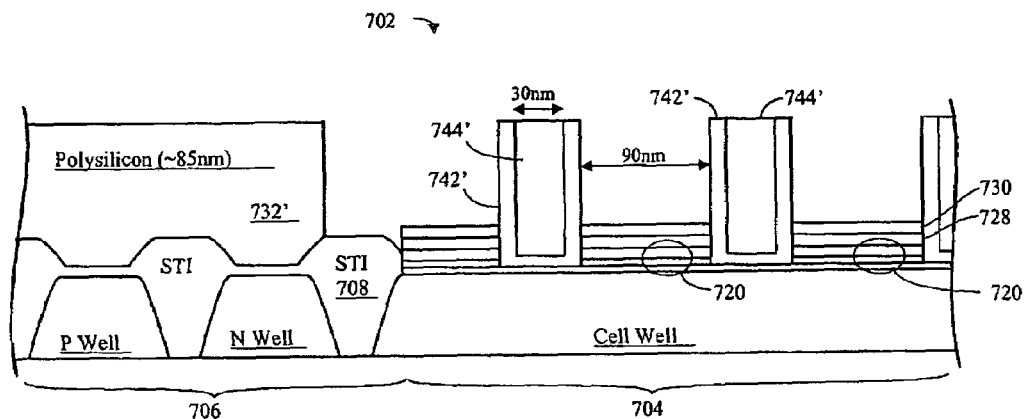
Figure 7K:
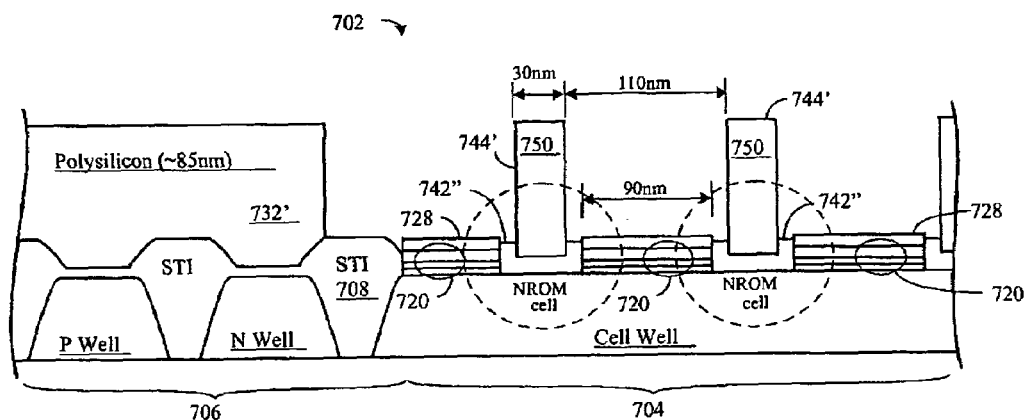
Figure 7L:
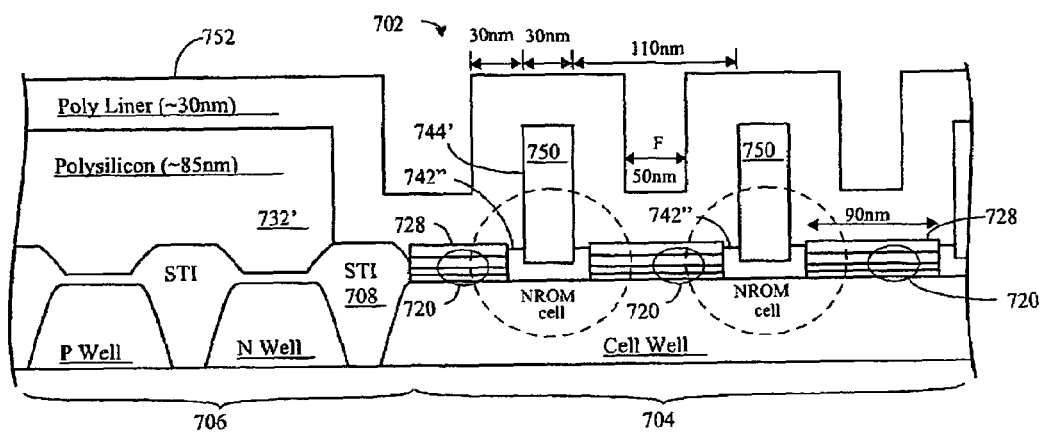
Figure 7M:
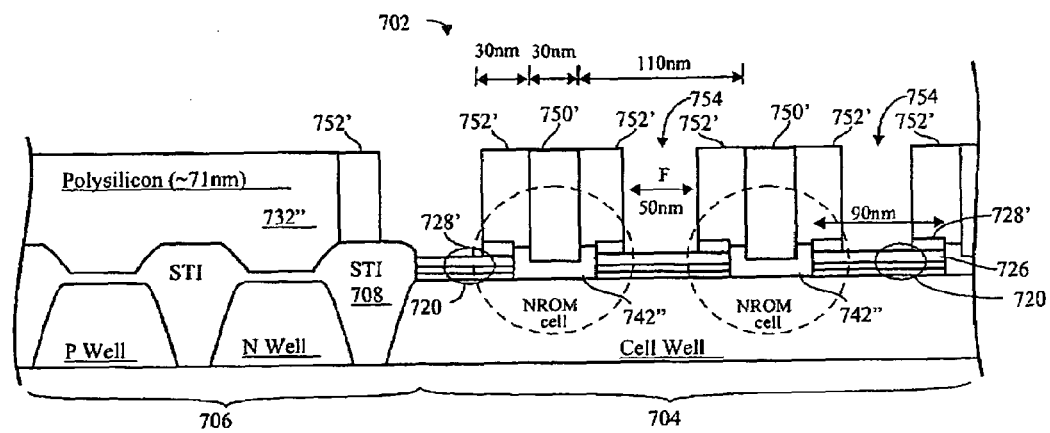
Figure 7N:
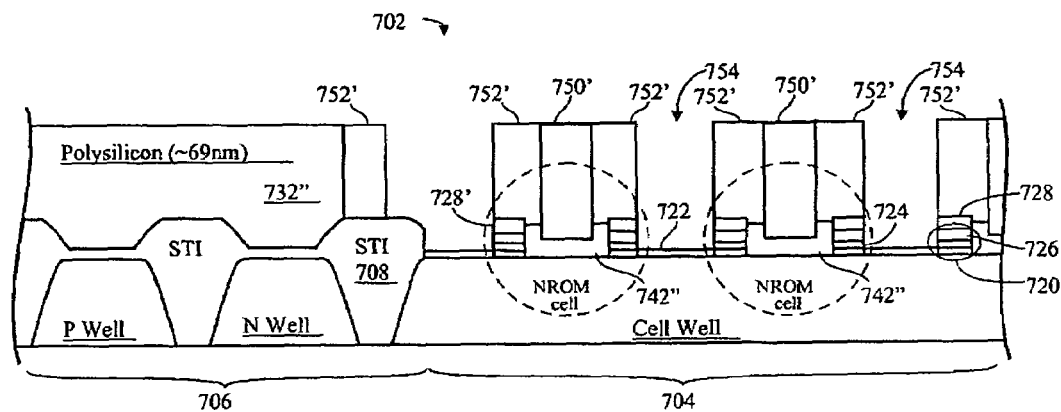
Figure 7O:
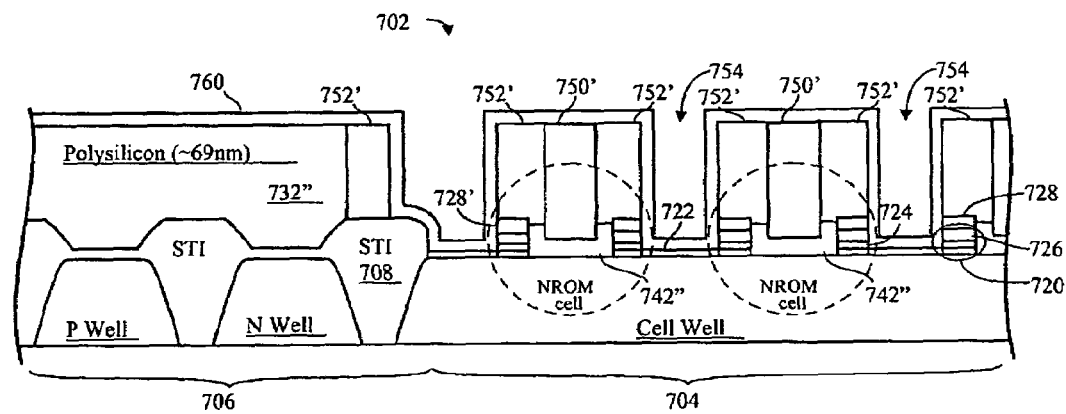
Figure 7P:
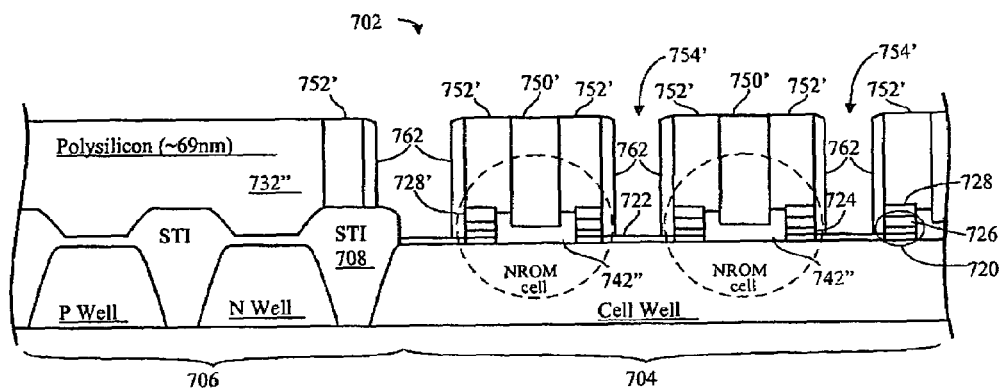
Figure 7Q:
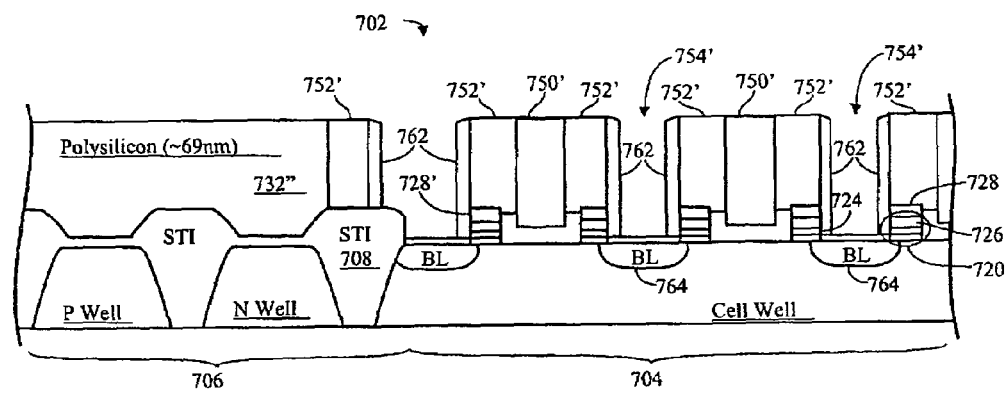
Figure 7R:
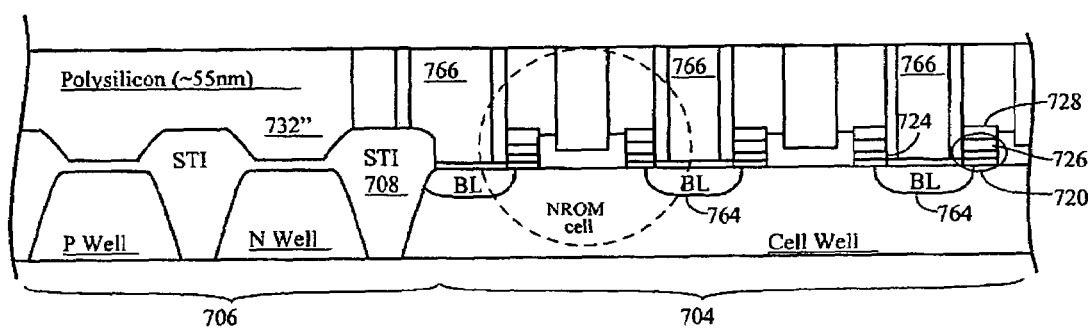

FIGS. 7A-7R are cross-sectional views of NROM cells with nitride strips being formed, and correlate to the process flow of FIG. 6.

Generally, all of the individual processing steps described herein use conventional semiconductor fabrication techniques of deposition, implanting, masking, etching, polishing, and the like, and are well known to those having ordinary skill in the art to which the present invention most nearly pertains.

Generally, dimensions which awe presented herein are intended to be illustrative, not limiting, to provide a sense of proportion to the various elements.

FIG. 7A shows a semiconductor substrate 702 which has been processed to form a starting structure having a memory array portion 704 (to the right of the figure, as viewed) and a periphery (CMOS logic) portion 706 (to the left of the figure, as viewed).

The CMOS logic portion 706 comprises N Wells and P Wells, separated by STI (shallow trench isolation) oxide, and covered by LV (low voltage) oxide and HV (high voltage) oxide.

An STI oxide 708 separates (is at the intersection of) the periphery portion 706 and the array portion 704, and isolates the two portions from one another.

A conventional ONO layer 720 is formed on the array portion, and may comprise:
- a bottom oxide layer 722 (compare 322), for example 4 nm thick;
- a middle nitride layer 724 (compare 324), for example 4 nm thick; and
- a top oxide layer 726 (compare 326), for example 10 nm thick.

The ONO layer 720 may be annealed, using a conventional thermal anneal process.

In a step 602 ("Poly/Oxide (PO) Cap on ONO"), a layer of poly 728 is disposed over the ONO layer, and a layer of oxide 730 is disposed over the poly layer 728. The oxide layer 730 acts as an etch stop for a subsequent poly etch and as a barrier to the subsequent hot phosphoric strip. Its thickness is adjusted accordingly. The poly layer 728 acts a barrier to a subsequent wet oxide liner strip. Its thickness is determined by the oxide undercut and barrier effectiveness. The poly layer 728 and the oxide layer 730 may be formed immediately after ONO anneal. The poly and oxide form a poly/oxide (PO) cap on the ONO layer.

As will become evident from the process flow, a paramount concern was that in creating ONO strips, it is desired to maintain the integrity and characteristics of the original ONO stack. To this end, the use of sacrificial layers such as PO (Poly/Oxide), NO (Nitride/Oxide), etc. was considered and the integrity of the original ONO stack can be maintained. Inherent in the process is also the use of standard technologies (as opposed to developing new technologies) and the independent targeting of key technology parameters such as the width of the ONO strips, the channel doping and profile, the BL junction doping and profile, and so forth.

Next, in a step 604 ("Poly Deposition"), a layer of polysilicon (Poly-1) 732 is deposited, using a conventional poly deposition process, to a initial thickness of approximately 90 nm. See FIG. 7B.

The Poly-1 layer 732 is planarized, using a conventional CMP process, resulting in a loss of approximately 5 nm of thickness (resulting poly thickness, ~85 nm).

During subsequent poly liner etchback, the Poly-1 layer 732 will lose another approximately 14 nm of thickness (resulting poly thickness, ~71 nm). The loss of 14 nm of poly thickness comes from 10 nm (thin poly on ONO ??)+4 nm (10% overetch).

During subsequent ONO and spacer etches, the Poly-1 layer 732 will lose another approximately 3 nm of thickness (resulting poly thickness, ~68 nm).

During subsequent poly and BL Oxide CMP, the Poly-1 layer 732 will lose another approximately 10 nm of thickness (resulting poly thickness, ~58 nm).

The resulting approximately 55 (~58) nm of thickness for the Poly-1 layer 732 should be sufficient for attaining an ample BL oxide thickness so as to maintain good BL oxide integrity, but not so much as to jeopardize the integrity of the narrow poly lines, and may be in the range of 40-70 nm.

Next, in a step 606 ("Periphery Protect Mask"), a periphery protect mask 734, such as of photoresist (PR), is applied atop the poly layer and is positioned so that in a subsequent etch step the Poly-1 layer 732 will be opened (removed from) atop the array area 704, as well as at the STI area 708 at the interface of the array area 704 and the CMOS area 706.

The Poly-1 layer 732 is then etched, using a conventional plasma etching process, stopping on the top oxide 730 of the PO layer resulting in a structure as shown in FIG. 7C.

The periphery mask 734 (of resist) is removed, using a conventional resist removal process, leaving the original approximately 90 nm of poly atop the periphery area 706. The entire array area 704 is exposed (no poly remaining), as well as the STI oxide structure 728 at the interface of the periphery area 706 and the array area 704.

Next, in a step 608 ("Nitride Deposition"), a hard mask layer 736 such as of nitride, is deposited using a conventional nitride deposition process, to a thickness greater than approximately 120 nm (90+30), atop the entire substrate 702. The nitride layer 736 should be deposited to a thickness which is greater than the thickness (~90 nm) of the Poly-1 layer 732. The resulting structure is shown in FIG. 7D.

Next, in a step 610 ("Nitride CM"), the nitride hard mask layer 736 is planarized (now labeled 736' (prime)) using a CMP process, leaving approximately 30 nm of nitride over the Poly-1 layer 732. The resulting structure is shown in FIG. 5E.

The remaining (30 nm) nitride 736' covering the periphery 706 need only be sufficient to act as an implant stop (for subsequent cell threshold and punch through implants).

Next, in a step 612 ("CELL Formation, OPON Etch"), the nitride hard mask layer 736' is opened, in the array area 704, using a conventional plasma etch process. The oxide 730, poly 728, top oxide 726 and nitride 724 layers (OPON) are also etched, using a conventional plasma etch process, stopping on the bottom oxide 722 (O), leaving about 2 nm of bottom oxide 722 on the surface of the substrate 702. The resulting structure is shown in FIG. 7F.

Openings 738 are shown extend to the bottom oxide 722, and have a width "F" of approximately 50 nm. The opening of the nitride layer 736' may be done with an inverse BL mask, which opens the cell area for channel formation.

This creates a plurality of vertical structures 740 comprising ONO covered by PO, covered with nitride. The vertical structures 740 are spaced a distance "F" (where F is the minimum lithography feature) of approximately 50 nm apart from one another. The openings 738 between the vertical structures 740 are for subsequent cell channel formation.

The width (Ld) of a vertical structure 740 is approximately 90 nm. The center-to-center distance LD between vertical structures is approximately 90 nm.

$LD = 2Ld(ONO) + F$ (BL space)

$Ld(ONO) = 20$ nm ONO strips (discussed hereinbelow)

Next, in a step 614 ("Cell Gate Oxide"), the bottom oxide 722 remaining after the previous etch step is cleaned (removed) if necessary, and a new oxide 742 is deposited and densified, using conventional gate oxide process, to a thickness of approximately 10 nm. (This reduces the effective size of the openings in the nitride mask.) The resulting structure is shown in FIG. 7G.

As illustrated, the oxide 742 covers everything, including the exposed surface of the substrate in the openings 738 between the vertical structures 740, the sidewalls of the vertical structures 740 and the surface of the nitride hard mask 736' in the periphery area 706.

Since the oxide covers the sidewalls of the openings 738 between the vertical structures 736' are reduced from their original size (F) by 2× the thickness of the oxide, so that the new size F' for the opening 738' (prime) is approximately 50 nm–2× approximately 10 nm, or approximately 30 nm.

Cell punch through (PT) and threshold adjust implants (not shown) can now be made, through the reduced-size openings, using conventional processes.

Next, in a step 616 ("Poly Deposition and Fill"), polysilicon (Poly-2) 744 is deposited, using a conventional poly deposition process. The resulting structure is shown in FIG. 7H.

Sufficient poly 744 needs to be deposited so that the BL openings 738 are overfilled for subsequent CMP.

Next, in a step 618 ("Poly CMP"), the Poly-2 744 is planarized, using a conventional CMP process. The resulting structure is shown in FIG. 7I. The planarized Poly-2 is labeled 744' (prime).

This (2nd) CMP removes a top portion of the Poly-2 744, proceeds through a top portion of the new oxide 742, proceeds through the nitride 736' overlying the Poly-1 732 in the periphery area 706, and stops on the Poly-1 732, resulting in removal of approximately 5 nm of Poly-1 732. Poly-1 732 now has a thickness of approximately 85 nm, and is labeled 732' (prime). The further thinned nitride 736' is labeled 736" (double prime). The remaining oxide 742 is labeled 742' (prime).

The height of the Poly-2 744' in the BL opening 738 is approximately 75 nm, and sits atop 10 nm of new oxide 742.

Next, in a step 620 ("Wet Nitride Strip"), remaining nitride 736" is removed, using a conventional Wet Nitride Strip process. The resulting structure is shown in FIG. 7J.

At this stage of the process, the Poly-2 structures 744' have a width of approximately 30 nm. They sit atop 10 nm of "new" oxide 742' and their sidewalls are covered with 10 nm of oxide 742' as described hereinabove (see step 614, FIG. 7G).

At this stage of the process, the Poly-2 structures 744' (including sidewall liner oxide 742') are spaced approximately 90 nm apart from one another. (From sidewall liner oxide 742' of one Poly-2 structure 744' to the sidewall liner oxide 742' of an adjacent Poly-2 structure 744', is 90 nm.)

Next, in a step 622 ("Sidewall Liner Oxide Strip"), the sidewall liner oxide 742' is stripped from the Poly-2 structures 744', using a conventional wet oxide etch process. The resulting structure is shown in FIG. 7K.

During this process, the uppermost oxide 730 of the original ONOPO is removed (leaving ONOP). (Substantially all of the layer 730 of sacrificial oxide is removed.) The STI oxide 708 also loses approximately 10 nm during this oxide etch, but typically these STI oxides are approximately 300 nm thick and so a 10 nm loss is relatively insignificant.

Also, the sidewall liner oxide 742' adjacent the poly layer 728 of ONOP is undercut—in other words, etched down below the top of the poly 728, but not reaching the ONO 720, else it would etch the top layer (726) of the ONO 720.

The resulting Poly-2 structures 744', without sidewall liners, are very narrow (approximately 30 nm), and the integrity of these narrow 744' poly lines has to be maintained during the wet oxide strip. These narrow poly lines 744' are now relabeled 750, and are now referred to as "poly lines". The poly lines will eventually serve as the gates for NROM cells.

The spacing between adjacent poly lines 750 is approximately 110 nm. The width of the ONOP stack is approximately 90 nm. A given ONOP stack is located between two adjacent poly lines 750 spaced apart from each by 10 nm (the thickness of the original sidewall oxide).

Attention is directed to the individual ONO stacks 720 shown in FIGS. 7J and 7K (as well as in FIGS. 7F and 7G and FIGS. 7H and 7I). Ordinarily, each of these stacks 720 would eventually become (after subsequent processing steps) an associated NROM cell. Compare, for example, the situation described hereinabove with respect to FIG. 5B. As suggested hereinabove (with respect to FIG. 5C), each ONO stack 720 will be divided in two, and halves of two adjacent ONO stacks will become a given NROM cell, as described hereinbelow. The general location of a future NROM cell is indicated by the dashed-line circle in FIG. 7K. Notice that there are three ONO stacks 720 shown. As discussed with respect to FIG. 5C, for a row of "n" ONO stacks, there will be n−1 NROM cells. Only three ONO stacks are shown, resulting in two NROM cells, for illustrative clarity. In reality, "n" would be much greater than the three—for example 1029, resulting in 1028 NROM cells.

As described with respect to FIG. 5C, the endmost ONO stacks are only partially used. With regard to the overall width of the left end stack 720, adjacent the perimeter STI 708, spacing in this region is determined by fanout considerations, which means ensuring that there is sufficient space to make connections between array word and bit lines and the neighboring CMOS logic.

Next, in a step 624 ("Poly Liner Deposition"), a third polysilicon ("poly liner") 752 is deposited, using a conventional deposition process. The resulting structure is shown in FIG. 7L.

The poly liner 752 is deposited to have a thickness of approximately 30 nm, based on an assumed 20 nm nitride strip requirement plus the width of the previous oxide liner 742 (742'). The thickness of the poly liner 752 should be sufficient that, when acting as a sidewall liner on the poly lines 750, it extends approximately ⅓ of the width across an ONO stack 720. This will define the size of nitride strips which will be formed from the ONO stack 720. Nominally, each nitride strip is a first fraction "s", such as ¼ the width "w" of the stack 720, separated from each other by another fraction "r", such as ½ of the width "w" of the stack 720, as described hereinbelow. (2s+r=w). Note that s<r. As is evident, using the techniques disclosed herein, it is the dimension of the poly line 750 (750') and the poly spacer 752 (752') that determines the split (gap) between nitride strips in a given NROM cell.

Note that there is poly liner 752 atop Poly-2 732', on a side of Poly-2 732', atop STI 708, atop the poly 728 atop the ONO 720, atop the poly lines 750, as well as on the sides of the poly lines 750.

Next, in a step 626 ("BL Formation—Poly Liner Etchback"), poly liner 752 is etched, using a conventional isotropic process such as plasma etch, removing poly from on top of other structures, while leaving it on the sides of other structures. The resulting structure is shown in FIG. 7M. The etch process removes the poly 728, stopping on top oxide 726 of the ONO stack 720.

In this etch step, any poly underlying poly liner 752 will be etched. The poly 728 is removed, stopping on oxide 726. First of all, the poly liner 752 is now labeled 752' (prime). The underlying Poly-2 732' had a thickness of approximately 85 nm, and now has a thickness of approximately 71 nm, and is labeled 732" (double prime).

In the resulting structure, there is poly liner 752' (prime) remaining on the sidewalls of Poly-2 732". More importantly, there is poly liner 752' remaining, as a sidewall spacer, on the sidewalls of the poly lines 750' (prime).

The space between poly lines 750'/752' is "F" (the minimum litho feature size), which is approximately 50 nm, which is the original 110 nm less two times the thickness (30 nm) of the poly liner deposition.

During this process, the poly (P) 728 over ONO becomes removed. A central portion of the top oxide layer 726 of the ONO stack 720 is now exposed. The outer edges of the ONO stack are covered by remnants (vestiges) of the original poly 728 (now labeled 728'), and sidewall liner poly 752'. (All but a portion of the layer 728 of sacrificial poly is removed.) The original ONO stack 720 has a width of approximately 90 nm. Now, only approximately 50 nm ("F") of the ONO stack 720 is exposed, in the space between adjacent poly liners 752'.

During this process, the poly-2 732 in periphery area 706 becomes thinned approximately 14 nm (it was approximately 85 nm, thick, and is now approximately 71 nm thick), and is labeled 732" (double prime). The STI oxide 708 at the interface is partially covered (by poly 752').

What can be observed in FIG. 7M are essentially complete NROM cells (but lacking the bitline diffusions, described hereinbelow). Each cell has a two nitride strips from what was originally two distinct, adjacent ONO stacks 720, covered by a wide conductive structure comprising a poly line (750') plus poly liner (752'), which will function as the gate of the NROM cell as well as serving as a wordline in an array. Bitline diffusions will be performed in the "F" spaces (bitline openings 754) between adjacent poly structures 750'/752'.

Next, in a step 628 ("BL Formation—ONO Etch"), the exposed central portion of the ONO stack 720 is etched, etching away top oxide 726 and the nitride 724, and stopping on the bottom oxide 722, using a conventional dry etch processes. The bottom oxide 722 is left in place to protect the underlying silicon The resulting structure is shown in FIG. 7N.

During this step, the Poly-2 732" may also become thinned, by about 2 nm (now shown as having a thickness of 69 nm rather than 71 nm), as a result of the previous oxide and nitride etches.

In subsequent steps, buried bitlines (BB) will be formed under the bitline openings 754, by implanting through the remaining bottom oxide 722. The 754 opening size F is small (approximately 50 nm), reduced from its original size of 110 nm, as a result of 30 nm thick sidewall spacers 752' on the poly lines 750'.

Similar bitline construction techniques (using sidewall spacers to reduce "F") are disclosed in commonly-owned, copending U.S. Patent Publication No. 2006/0084219 (published Apr. 20, 2006) which discloses an NROM structure and method of fabrication (hereinafter referred to as the '219 patent).

In addition to being an initial step in the formation of buried bitlines, this step 628 performs the important function of taking one continuous ONO layer and separating it into two strips (or stripes). As discussed hereinabove, a ONO strip from one stack and a ONO strip from an adjacent stack function as two physically separated (yet coplanar) charge storage areas in a given NROM cell, avoiding problems associated with far-from-junction injection.

Next, in a step 630 ("BL Formation—Spacer Deposition"), a layer (liner) 760 of oxide, having a thickness of approximately 10 nm, is deposited, using a conventional oxide deposition process. The resulting structure is shown in FIG. 7O.

Next, in a step 632 ("BL Formation—Spacer Etch"), the horizontal portions of the oxide liner 760 are etched, using a conventional plasma dry etching process. Remaining are the vertical portions of the oxide liner 760, forming sidewall spacers 762 on the poly elements 752'. The resulting structure is shown in FIG. 7P.

During this step, the thin bottom oxide on the substrate in the BL opening 754 becomes removed, so it is re-created by re-oxidation, using a conventional oxidation process, and is now labeled 764. The purpose of this thin (2-5 nm) layer of oxide is primarily to prevent channeling of the implanted species. (The purpose of the original bottom oxide layer 722, when it is under nitride in an NROM cell, is to insulate the nitride from the FET channel in the underlying silicon.)

The bitline opening 754' (prime) is now approximately 30 nm (the original 50 nm less to 10 nm sidewall spacer thicknesses).

Next, in a step 634 ("BL Formation—BL Implant"), the bitline (BL) diffusions 764 are implanted, through the bitline openings 754', using a conventional implant process. The resulting structure is shown in FIG. 7Q. (Although a BL diffusion is shown next to the STI 708, this BL implant serves no useful purpose, since it is not associated with an NROM cell.)

The Arsenic (bit line) and Indium (pocket, if necessary) implants should be low KeV implants. A suitable material and dosage for BL implant is $2\times10^{15}$ cm$^2$, 20 KeV, Arsenic. Note that there is no hard mask. Hence, a pocket implant (if necessary) should be low KeV Indium. Also, the BL implant needs to be at low energy so as not to penetrate through the reduced (~68 nm) poly 732". Else, the poly height could be increased to allow for an increase in KeV.

The process parameters are targeted to achieve approximately a 5 nm overlap (OL) of BL under the edge of the ONO stack.

FIG. 7R shows two substantially complete NROM cells, formed from three ONO stacks, each ONO stack contributing one of two nitride stripes to a given NROM cell, complete with exemplary buried bitline diffusions functioning as source or drain (depending on the operation being performed on the NROM cell), with poly gates.

Next, in a step 636 ("Oxide Fill and CMP"), oxide 766 is deposited to fill (overfill) the bitline openings 754' using conventional oxide deposition process. Then, excess oxide is removed, using a conventional CMP process. The resulting structure is shown in FIG. 5R.

As a result of CMP, another approximately 13 nm are removed from peripheral poly 732" (68–13=55). Thus, the height of the poly lines 750' is now also approximately 55 nm.

Note, in the previous figure (FIG. 5Q) that the tops of the spacer walls 762 were tapered. In this step, the poly should be planarized to the point where the spacer walls 762 are vertical from the top down.

FIGS. 7A-7R (18 figures) correspond to pages 3-20 (18 pages) of the provisional patent application from which this application claims priority. Pages 21-22 relate to wordline formation and, as stated at the last page (page 23) of the provisional, "The Remaining DDNS flow is the same as the standard DDNROM flow".

In a step 438 ("WL Formation"), conventional steps are performed to form wordlines.

In a step 440 ("Remaining Flow"), conventional steps are performed to connect the cells in the array area 704 to control circuitry in the CMOS area 706, including fanout, as described hereinabove.

It will be appreciated that word line sets formed as part of different process steps (e.g. even and odd word lines) of a double density process (as elaborated in U.S. application Ser. No. 11/489,237 which is incorporated into the present application by reference), may be of slightly differing widths.

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions and sub-combinations.

What is claimed is:

1. Non-volatile memory (NVM) cell comprising:
an ONO layer disposed on a semiconductor substrate and comprising a plurality (n) of ONO stacks;
for a given memory cell, a gate formed atop a portion of a given ONO stack and an adjacent portion of another ONO stack;
a first set of word lines disposed atop of a first set of gates;
a second set of word lines disposed atop of a second set of gates;
wherein the word lines of said first set have a width different from word lines of said second set.

2. The NVM cell of claim 1, further comprising:
vestiges of a sacrificial poly layer on outer edges of the ONO stacks.

3. The NVM cell of claim 1, wherein: the NVM cell is an NROM cell.

* * * * *